United States Patent
Ray et al.

(10) Patent No.: US 10,169,520 B2
(45) Date of Patent: Jan. 1, 2019

(54) METHOD OF RECONFIGURING UNCROWNED STANDARD CELLS AND SEMICONDUCTOR APPARATUS INCLUDING UNCROWNED AND CROWNED CELLS

(71) Applicant: TAIWAN SEMICONDUCTOR MANUFACTURING COMPANY, LTD., Hsinchu (TW)

(72) Inventors: Prasenjit Ray, Hsinchu (TW);
Lee-Chung Lu, Taipei (TW);
Meng-Kai Hsu, Xinfeng Township (TW); Wen-Hao Chen, Hsinchu (TW);
Yuan-Te Hou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 107 days.

(21) Appl. No.: 15/471,146

(22) Filed: Mar. 28, 2017

(65) Prior Publication Data
US 2018/0004886 A1    Jan. 4, 2018

Related U.S. Application Data

(60) Provisional application No. 62/357,143, filed on Jun. 30, 2016.

(51) Int. Cl.
*G06F 17/50* (2006.01)

(52) U.S. Cl.
CPC ...... *G06F 17/5077* (2013.01); *G06F 17/5081* (2013.01)

(58) Field of Classification Search
CPC .................. G06F 17/5077; G06F 17/5081
USPC ........................................... 716/130
See application file for complete search history.

(56) References Cited

U.S. PATENT DOCUMENTS 5,510,999 A * 4/1996 Lee ..................... G06F 17/5068
                                                      257/E27.105
2017/0047374 A1* 2/2017 Lu ........................... H01L 43/12

* cited by examiner

*Primary Examiner* — Suchin Parihar
(74) *Attorney, Agent, or Firm* — Hauptman Ham, LLP

(57) ABSTRACT

A method is applied to reconfigure a set of uncrowned standard cells in a layout of a semiconductor apparatus. Each uncrowned standard cell includes a standard first array. Each standard first array includes a first stacked arrangement of vias interspersed with first segments of corresponding M(i)~M(N) metallization layers. The M(N) metallization layer includes second segments which connect corresponding first segments of the M(N) metallization layer in the first standard arrays. The method includes crowning each first standard array in the set with a corresponding second standard array. Each standard second array includes a second stacked arrangement of vias interspersed with corresponding first segments of corresponding M(N+1)~M(N+Q) metallization layers. The method further includes: adding, to the M(N+Q) layer, second segments which connect corresponding first segments of the M(N+Q) metallization layer in the corresponding second standard arrays.

20 Claims, 24 Drawing Sheets

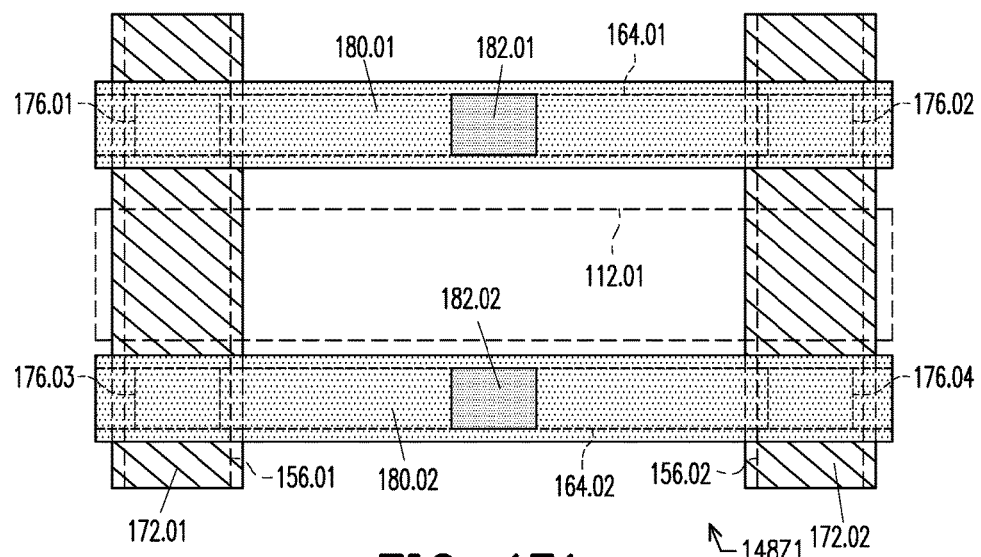
FIG. 1Z1
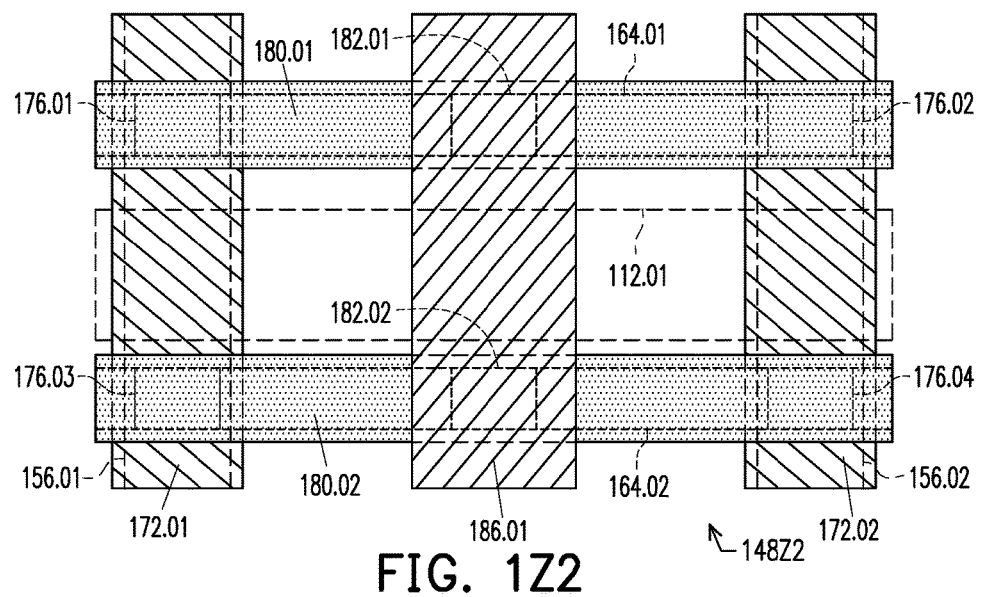
FIG. 1Z2

METHOD OF RECONFIGURING UNCROWNED STANDARD CELLS AND SEMICONDUCTOR APPARATUS INCLUDING UNCROWNED AND CROWNED CELLS

BACKGROUND

A semiconductor apparatus, one or more of which are included in an integrated circuit (IC), includes a number of electronic devices. One way in which to represent a semiconductor device is with a plan view diagram referred to as a layout diagram (hereinafter, layout). A layout is hierarchical and is decomposed into modules which carry out higher-level functions as required by the semiconductor device's design specifications. In some circumstances, a semi-custom design (SCD) project decomposes the modules into macro cells, standard cells and custom cells.

For a given SCD project, a custom cell is designed with an arrangement that is specific to the given SCD project in order to provide (in operation) a higher-level logic function that is specific to the SCD project. By contrast, a library of standard cells is designed with no particular project in mind and includes standard cells which provide (in operation) common, lower-level logic functions. Designing a layout using a library of standard cells (standard cell library) which includes physical cell structures having a predetermined uniform layout pitch facilitates dense packing of the cells, and, thus, dense placement of the transistors.

A standard cell includes a device layer and a first array on the device layer. The standard device layer includes one or more semiconductor devices, and inter-layer connection structures correspondingly connected to one or more components of the corresponding one or more semiconductor devices. A standard first array includes a stacked arrangement of vias interspersed with corresponding first segments of corresponding M(i)~M(N) metallization layers (where i and N are non-negative integers and i<N) such that the first segments of the M(N) metallization layer are connected to corresponding one or more semiconductor devices (in the device layer) underlying the M(i) layer. Second segments of the M(N) metallization layer connect corresponding first segments of the M(N) metallization layer in the first standard arrays and thereby connect the corresponding standard cells. Adopting a minimal number of configurations for the first arrays further facilitates dense packing of cells.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 1Z1-1Z2 are layout diagrams of corresponding standard second arrays, in accordance with some embodiments.

DETAILED DESCRIPTION

Figures 1A, 1B:
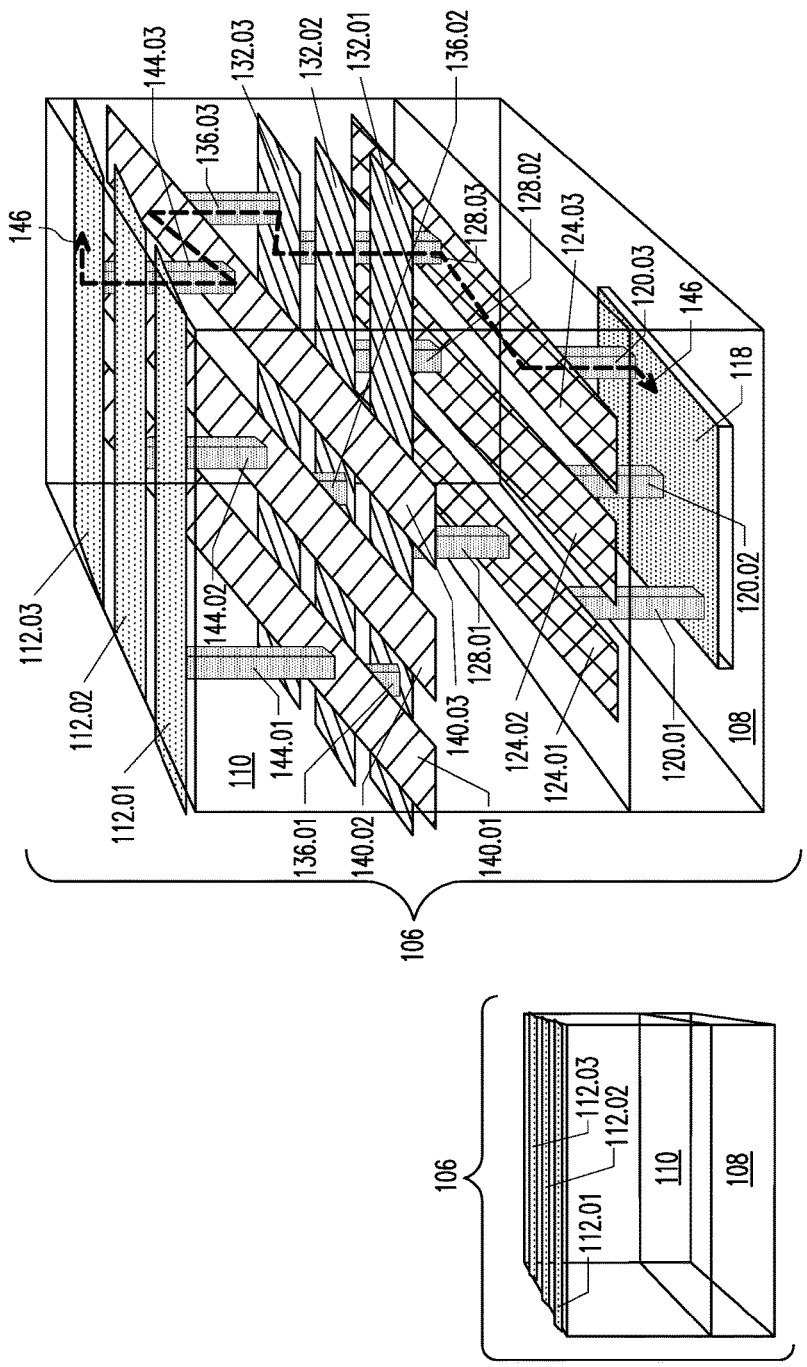
FIG. 1A is a three-quarter perspective drawing of an uncrowned standard cell for a semiconductor device, in accordance with some embodiments.
FIG. 1B is a simplified version of FIG. 1A.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the context of M(i)-M(N) metallization layers (where i and N are non-negative integers and i<N), where test data reveals that one or more second segments of the M(N) metallization layer which connect a set of (explained below) standard cells are underperforming relative to quality-assessment criteria (in terms, e.g., of signal propagation delay, electromigration susceptibility/degradation, or the like), performance can be improved through reconfiguration. In particular, the set can be reconfigured by disconnecting (e.g., removing) the underperforming one or more second segments of the M(N) metallization layer, appending each standard cell with a standard second array disposed on the first array, and reconnecting the crowned standard cells. In some embodiments, appending a standard second array onto a first standard array is referred to herein as 'crowning' the first standard array because the standard cell is changed physically as a result and because the standard second array is disposed on the standard first array. Without the standard second array, the standard cell is referred to herein as 'uncrowned.' With the standard second array, the standard cell is referred to herein as 'crowned.' In some embodiments, each standard second array includes a second stacked arrangement of vias interspersed with corresponding one or more of first segments of corresponding M(N+1)~M(N+Q) metallization layers (where Q is a non-zero, positive integer) such that the one or more of the first segments of the M(N+Q) metallization layer are correspondingly connected to the one or more first segments of the M(N) metallization layer of the corresponding first standard array. In some embodiments, the reconnecting includes adding, to the M(N+Q) layer, one or more second segments which connect corresponding first segments of the M(N+Q) metallization layer in the corresponding standard second arrays.

FIG. 1A is a three-quarter perspective drawing of an uncrowned standard cell 106 for a semiconductor device, in accordance with some embodiments, whereas FIG. 1B is a simplified version of FIG. 1A.

Figure 1C:
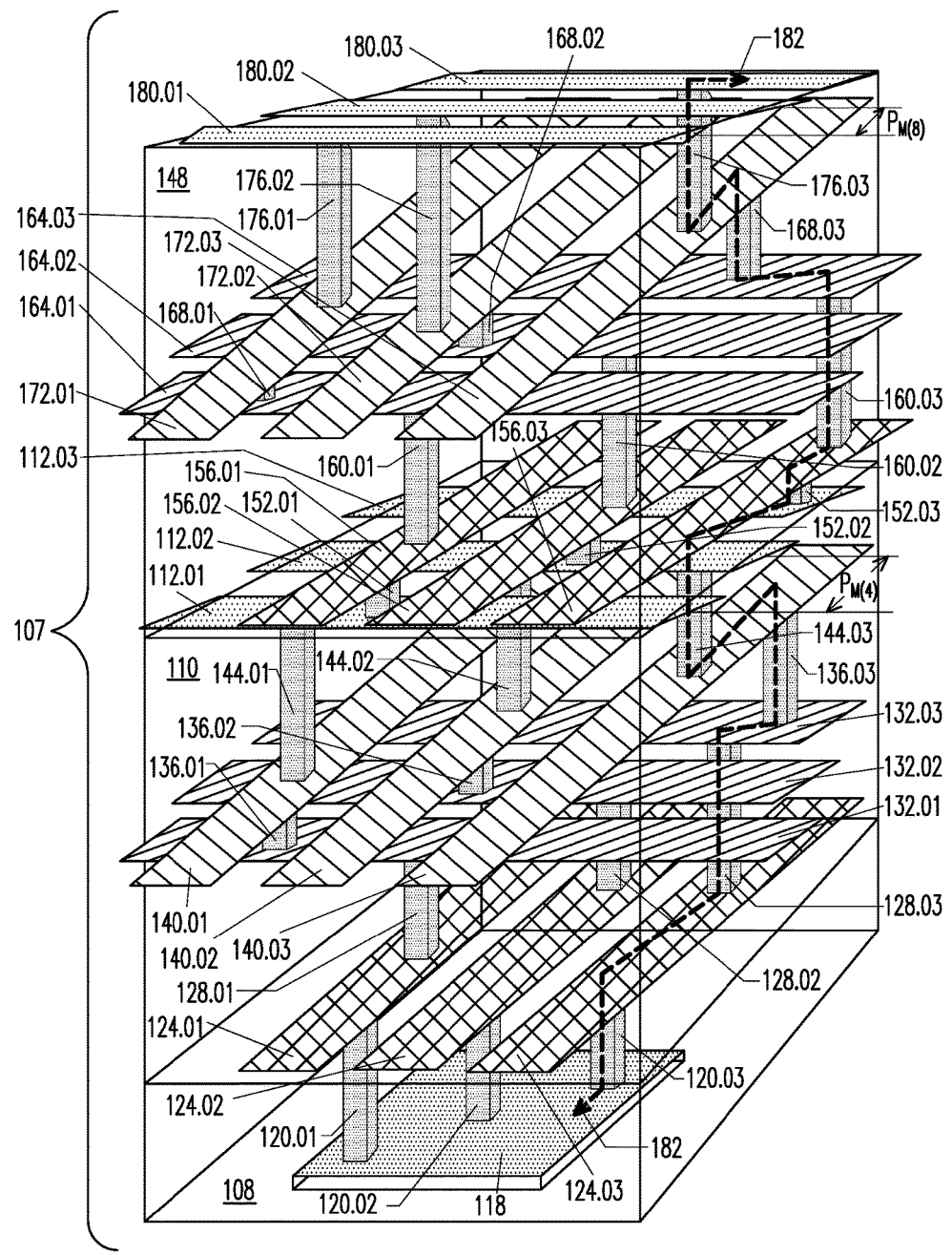
FIG. 1C is a three-quarter perspective drawing of a crowned standard cell for a semiconductor device, in accordance with some embodiments.
Figure 1D:
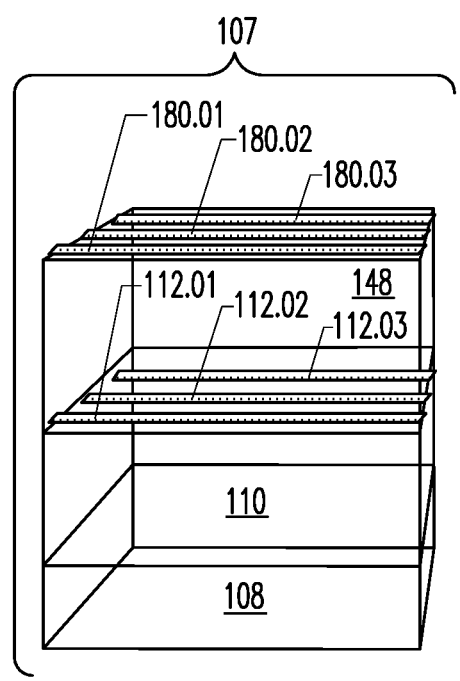
FIG. 1D is a simplified version of FIG. 1C.

FIG. 1C is a three-quarter perspective drawing of a crowned standard cell 107 for a semiconductor device, in accordance with some embodiments, whereas FIG. 1D is a simplified version of FIG. 1C.

In FIGS. 1C-1D, crowned standard cell 107 is regarded as being crowned because, relative to uncrowned standard cell 106 of FIGS. 1A-1B, a standard second array 148 has been disposed on a standard first array 110.

In FIG. 1A, uncrowned standard cell 106 includes a device layer 108 and a standard first array 110 on device layer 108. Standard device layer 108 includes: one or more semiconductor devices 118; and inter-layer connection structures 120.01, 120.02 and 120.03 correspondingly connected to one or more components of corresponding one or more semiconductor devices 118. In some embodiments, semiconductor devices 118 include transistors, diodes, capacitors or the like. In some embodiments, spaces/volumes in device layer 108 not otherwise occupied by semiconductor devices or inter-layer connection structures are filled with a dielectric (for simplicity, not shown in FIG. 1A). For simplicity, in FIG. 1A, semiconductor devices 118 are shown as having only three components to which are connected corresponding inter-layer connection structures 120.01, 120.02 and 120.03. Other numbers of semiconductor devices 118, and thus of corresponding components of semiconductor devices 118, are contemplated.

In some embodiments, inter-layer connection structures 120.01, 120.02 and 120.03 include first, second and third types of inter-layer connection structures. In some embodiments, the first type of inter-layer connection structure is known as a metal-zero-over-poly (MOPO or MP) contact, the second type of inter-layer connection structure is known as a via, and the third type of inter-layer connection structure is known as a metal-zero-over-oxide (MOOD or MD) contact. In some embodiments, a MOPO contact connects an underlying corresponding component of one of semiconductor devices 118, e.g., a gate electrode, to an overlying corresponding segment of an M(i) metallization layer through a corresponding via. M(i) is the first metallization layer overlying inter-layer connection structures 120.01, 120.02 and 120.03. According to some metallization-layer numbering schemes, i is the non-negative integer zero (i=0) such that M(i)=M(0). According to some other metallization-layer numbering schemes, i is the non-negative integer one (i=1) such that M(i)=M(1). The present disclosure assumes a metallization-layer numbering schemes in which i is the non-negative integer one (i=1) such that M(i)=M(1). In some embodiments, a MOOD contact connects an underlying corresponding component of one of semiconductor devices 118, e.g., a drain/source electrode, to an overlying corresponding segment of the M(i) metallization layer through a corresponding via. Additional details regarding the structure and manufacture of MOPO contacts and MOOD contacts are disclosed in commonly assigned U.S. patent application Ser. No. 13/965,648, filed Aug. 13, 2013, having Pre-Grant Publication No. US20150048424, and in commonly assigned U.S. patent application Ser. No. 13/939, 201, filed Jul. 11, 2013, having Pre-Grant Publication No. US20150015335, the entireties of each of which are hereby incorporated by reference. In some embodiments, M(i) is not the first metallization layer overlying inter-layer connection structures 120.01, 120.02 and 120.03 such that there is at least one metallization layer interposed between M(i) and inter-layer connection structures 120.01, 120.02 and 120.03.

Standard first array 110 includes a stacked arrangement of vias interspersed with corresponding one or more first segments of corresponding M(1)~M(N) metallization layers. Within a given one of the M(1)~M(N) metallization layers, segments are parallel. As between adjacent M(i) and M(i+1) ones of the M(1)~M(N) metallization layers, segments in the M(i) metallization layer are arranged orthogonally with respect to segments in the M(i+1) layer. Reducing the number of configurations for instances of standard first array 110 facilitates dense packing of cells.

In some embodiments, N is a non-zero, positive integer in a range 1≤N≤4. In FIG. 1A, N is shown as 4. Other positive integer values are contemplated for N.

Standard first array 110 includes parallel segments 124.01-124.03 of the M1 metallization layer. Inter-layer connection structures 120.01, 120.02 and 120.03 are correspondingly disposed under and connected to segments 124.01-124.03 of the M1 metallization layer.

Standard first array 110 further includes: vias 128.01-128.03 correspondingly disposed on and connected to segments 124.01-124.03 of the M(1) metallization layer; parallel segments 132.01-132.03 of the M(2) metallization layer correspondingly disposed on and connected to vias 128.01-128.03; vias 136.01-136.03 correspondingly disposed on and connected to segments 132.01-132.03 of the M(2) metallization layer; parallel segments 140.01-140.03 of the M(3) metallization layer correspondingly disposed on and connected to vias 136.01-136.03; vias 144.01-144.03 correspondingly disposed on and connected to segments 140.01-

140.03 of the M(3) metallization layer; and parallel first segments 112.01-112.03 of the M(4) metallization layer correspondingly disposed on and connected to vias 144.01-144.03.

As such, in FIG. 1A, first segments 112.01-112.03 of the M(4) metallization layer are connected through corresponding first conductive paths to one or more components of corresponding one or more semiconductor devices 118 underlying the M(1) layer. For simplicity, only one of the three first conductive paths are called out in FIG. 1A, namely first conductive path 146. In particular, inter-layer connection structure 120.03, segment 124.03 of the M(1), via 128.03, segment 132.03 of the metallization layer M(2), via 136.03, segment 140.03 of the metallization layer 140.03, via 144.03 and segment 112.03 of the M(4) metallization layer M(4) represent portions of first conductive path 146.

For simplicity, in FIG. 1A (and the corresponding portions of FIG. 1C), each of the M(1)~M(4) metallization layers is shown as including 3 segments. Other numbers of segments in the M(1)~M(4) metallization layers, and more generally in the M(1)~M(N) metallization layers, are contemplated. In some embodiments, spaces/volumes in standard first array 110 not otherwise occupied by segments of a metallization layer or vias are filled with a dielectric (for simplicity, not shown in FIG. 1A, nor in FIGS. 1B-1D).

In FIG. 1C, standard second array 148 includes a stacked arrangement of vias interspersed with corresponding one or more first segments of corresponding M(N+1)~M(N+Q) metallization layers. Within a given one of the M(N+1)~M(N+Q) metallization layers, segments are parallel. As between adjacent M(i) and M(i+1) ones of the M(N+1)~M(N+Q) metallization layers, segments in the M(i) metallization layer are arranged orthogonally with respect to segments in the M(i+1) layer. Reducing the number of configurations for instances of standard second array 148 facilitates dense packing of cells.

In some embodiments, Q is a non-zero positive integer in a range $1 \leq Q \leq 4$. In FIG. 1C, Q is shown as 4. Other positive integer values are contemplated for Q. In some embodiments, $N \leq 4$ and $1 \leq Q \leq 4$. In some embodiments, N=4 and Q=5. In some embodiments, N=4 and Q=7.

Standard second array 148 further includes: vias 152.01-152.03 correspondingly disposed on and connected to first segments 112.01-112.03 of the M(4) metallization layer; parallel segments 156.01-156.03 of the M(5) metallization layer correspondingly disposed on and connected to vias 152.01-152.03; vias 160.01-160.03 correspondingly disposed on and connected to segments 156.01-156.03 of the M(5) metallization layer; parallel segments 164.01-164.03 of the M(6) metallization layer correspondingly disposed on and connected to vias 160.01-160.03; vias 168.01-168.03 correspondingly disposed on and connected to segments 164.01-164.03 of the M(6) metallization layer; parallel segments 172.01-172.03 of the M(7) metallization layer correspondingly disposed on and connected to vias 168.01-168.03; vias 176.01-176.03 correspondingly disposed on and connected to segments 172.01-172.03 of the M(6) metallization layer; and parallel first segments 180.01-180.03 of the M(8) metallization layer correspondingly disposed on and connected to vias 176.01-176.03.

As such, in FIG. 1C, first segments 180.01-180.03 of the M(8) metallization layer are connected through corresponding second conductive paths to one or more components of corresponding one or more semiconductor devices 118 underlying the M(1) layer. For simplicity, only one of the three first conductive paths are called out in FIG. 1C, namely first conductive path 182. In particular, inter-layer connection structure 120.03, segment 124.03 of the M(1), via 128.03, segment 132.03 of the metallization layer M(2), via 136.03, segment 140.03 of the metallization layer 140.03, via 144.03 segment 112.03 of the M(4) metallization layer M(4), via 152.03, segment 156.03 of the M(5) metallization layer; via 160.03, segment 164.03 of the M(6) metallization layer; via 168.03, segment 172.03 of the M(7) metallization layer; via 176.03 and segment 180.03 of the M(8) metallization layer represent portions of second conductive path 182.

For simplicity, in FIG. 1C, each of the M(5)~M(8) metallization layers is shown as including 3 segments. Other numbers of segments in the M(5)~M(8) metallization layers, and more generally in the M(N+1)~M(N+Q) metallization layers, are contemplated. In some embodiments, spaces/volumes in standard second array 148 not otherwise occupied by segments of a metallization layer or vias are filled with a dielectric (for simplicity, not shown in FIG. 1C, nor in FIG. 1D).

In FIG. 1C, the segments in each of the M(1)~M(8) metallization layers has a corresponding pitch. For simplicity, only two pitches are called out in FIG. 1C, namely a pitch $P_{M(4)}$ of the M(4) metallization layer and a $P_{M(8)}$ of the M(8) metallization layer. In some embodiments, a pitch $P_{M(N)}$ of the M(N) metallization layer is less than a pitch $P_{M(N+Q)}$ of the M(N+Q) metallization layer, $P_{M(N)} < P_{M(N+Q)}$. In some embodiments, N=4 and Q=4 such that pitch $P_{M(N)}$ of the M(N) metallization layer is pitch $P_{M(4)}$ of the M(4) metallization layer, pitch $P_{M(N+Q)}$ of the M(N+Q) metallization layer is pitch $P_{M(8)}$ of the M(8) metallization layer, and $P_{M(4)} < P_{M(8)}$.

In some embodiments, where segments in the M(N+Q) metallization layer are formed of a material having a similar conductivity as the material from which is formed segments in the M(N) metallization layer, because $P_{M(N)} < P_{M(N+Q)}$, the segments in the M(N+Q) metallization layer are wider and thus exhibit lower resistivity (or greater conductivity) than the narrower segments in the M(N) metallization layer. In some embodiments, the segments in the M(N+Q) metallization layer are formed of a material having a lower/smaller resistivity than the resistivity of a material from which is formed segments in the M(N) metallization layer.

In some embodiments, such as in FIG. 1C where N=4 and Q=4, $P_{M(4)} < P_{M(8)}$. In some embodiments, the M(1)~M(N) metallization layers have the same pitch. In some embodiments, such as in FIG. 1C where N=4, the M(1)~M(4) metallization layers have the same pitch. In some embodiments, the M(N+1)~M(N+Q) metallization layers have the same pitch. In some embodiments, such as in FIG. 1C where N=4 and Q=4, the M(5)~M(8) metallization layers have the same pitch. In some embodiments, as between adjacent underlying M(k) and overlying M(k+1) ones of the M(1)~M(N+Q) metallization layers, a pitch $P_{M(k)}$ of the M(k) metallization layer is less than or equal to a $P_{M(k+1)}$ of the M(k+1) metallization layer, $P_{M(k)} \leq P_{M(k+1)}$.

Figure 1E:
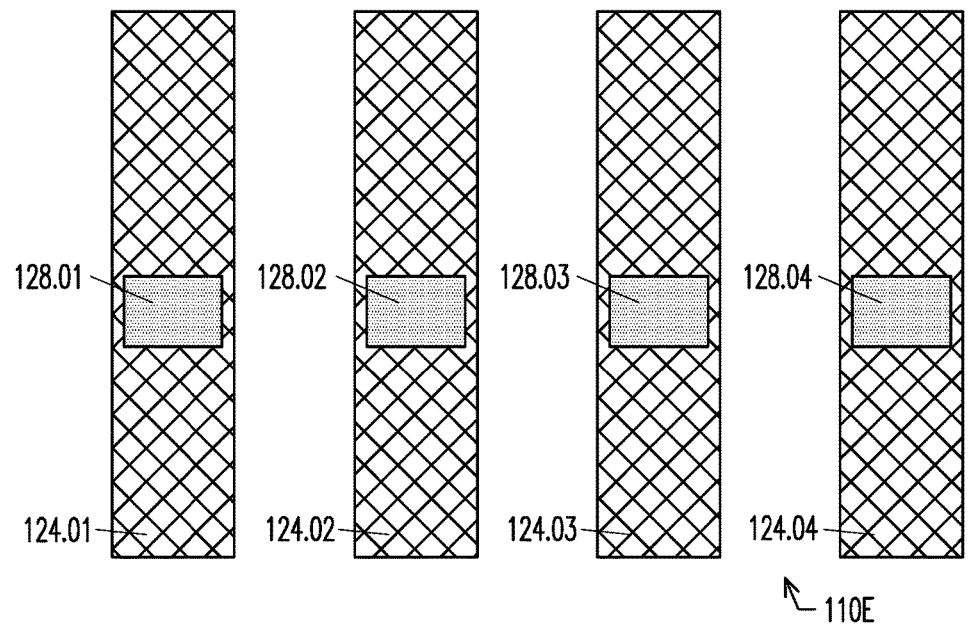
FIGS. 1E-1H are layout diagrams of corresponding standard first arrays, in accordance with some embodiments.
Figure 1F:
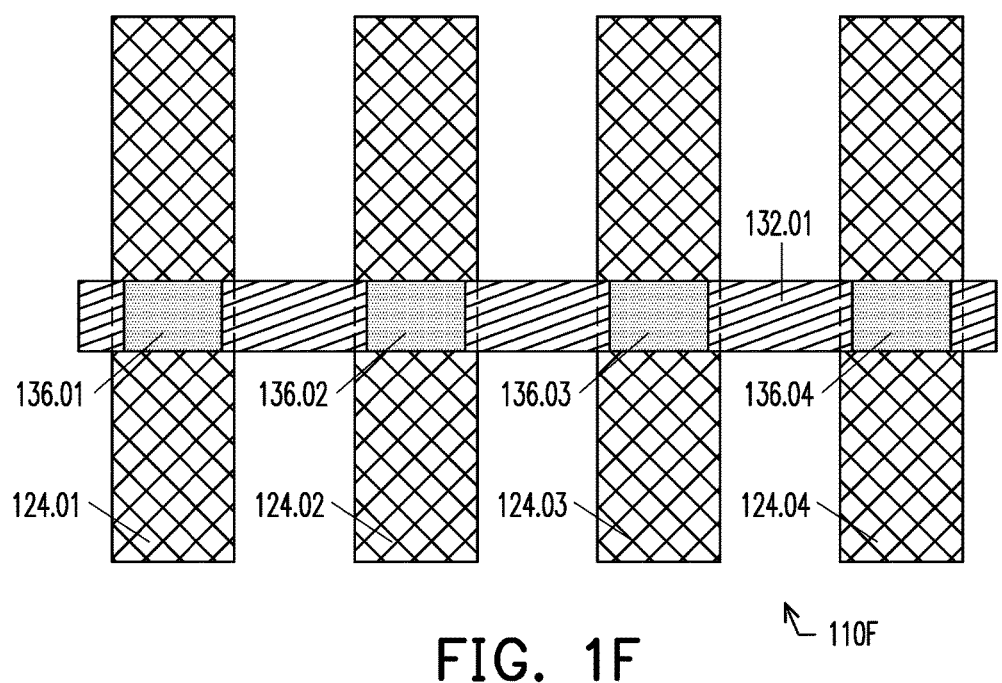
Figure 1G:
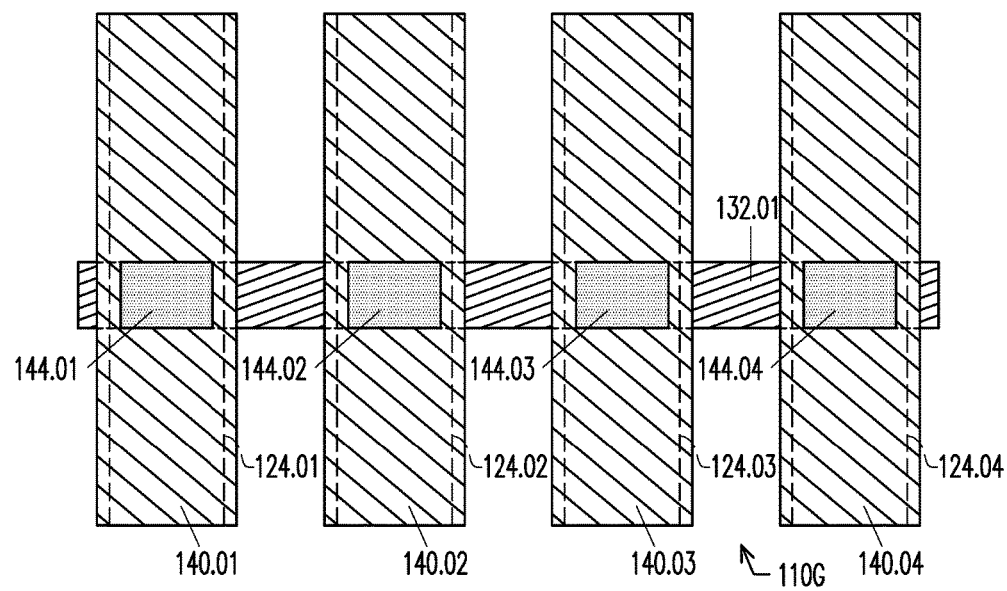

FIGS. 1E-1H are layout diagrams of corresponding standard first arrays 110E-110H, in accordance with some embodiments. Standard first arrays 110E-110G of corresponding FIGS. 1E-1G are inchoate versions of standard first array 110H of FIG. 1H. An inchoate version refers to a version which is not yet completed or fully developed.

In FIG. 1E, first standard array 110E includes parallel segments 124.01-124.04 of the M1 metallization layer. Corresponding inter-layer connection structures (not shown in FIG. 1E, but see FIG. 1A) are correspondingly disposed under and connected to segments 124.01-124.04 of the M1 metallization layer. Standard first array 110E further includes vias 128.01-128.04 are correspondingly disposed on and connected to segments 124.01-124.04 of the M(1) metallization layer. In some embodiments, a ratio of a pitch of segments 124.01-124.04 of the M(1) metallization layer, p(M(1)), to a width of each of segments 124.01-124.04 of the M(1) metallization layer, w(M(1)), is p(M(1))/w(M(1))≈2.

In FIG. 1F, standard first array 110F includes a segment 132.01 of the M(2) metallization layer correspondingly disposed on and connected to vias 128.01-128.04. Standard first array 110F further includes vias 136.01-136.04 correspondingly disposed on and connected to segment 132.01 of the M(2) metallization layer. In some embodiments, a width of each of segments 124.01-124.04 of the M(1) metallization layer, w(M(1)), is greater than a width of segment 132.01 of the M(2) metallization layer, w(M(2)). In some embodiments, a ratio of w(M(2)):w(M(1)) is about 0.54 such that if X=w(M(2))/w(M(1)), then X≈0.54.

In FIG. 1G, standard first array 110G includes parallel segments 140.01-140.04 of the M(3) metallization layer correspondingly disposed on and connected to vias 136.01-136.04. Standard first array 110G further includes vias 144.01-144.04 correspondingly disposed on and connected to segments 140.01-140.04 of the M(3) metallization layer. In some embodiments, a width of each of segments 140.01-140.04 of the M(3) metallization layer, w(M(3)), is greater than w(M(1)). In some embodiments, a ratio of w(M(1)):w(M(3)) is about 1.54 such that if X=w(M(1))/w(M(3)), then X≈1.54. In some embodiments, w(M(2))<w(M(3). In some embodiments, a ratio is w(M(2))/w(M(3))≈0.83. In some embodiments, w(M(2))<w(M(4)). In some embodiments, a ratio is w(M(2))/w(M(4))≈0.53. In some embodiments, w(M(3))<w(M(4)). In some embodiments, a ratio of w(M(3)):w(M(4)) is about 0.63 such that if X=w(M(3))/w(M(4)), then X≈0.63.

Figure 1H:
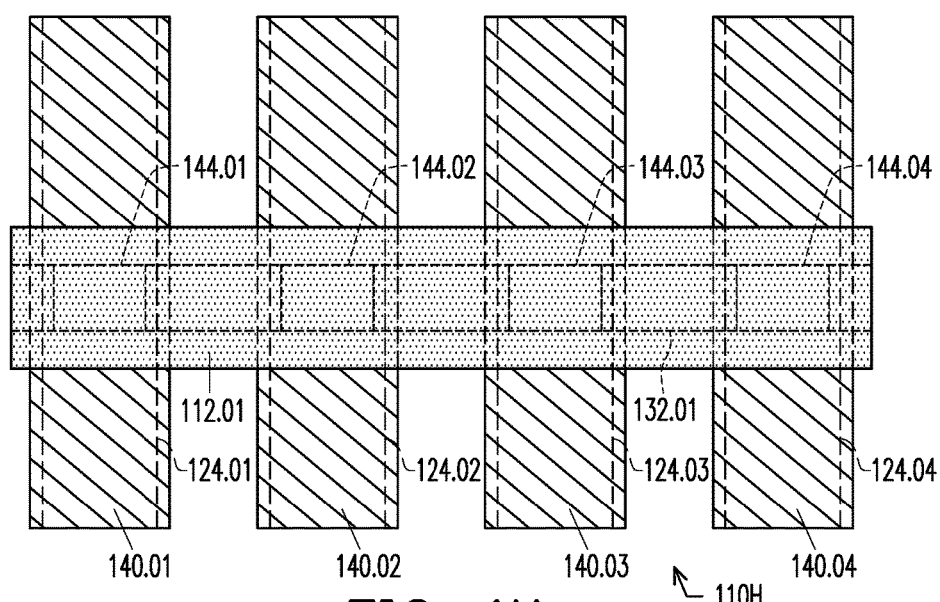

In FIG. 1H, standard first array 110H includes a first segment 112.01 of the M(4) metallization layer correspondingly disposed on and connected to vias 144.01-144.04.

Figure 1I:
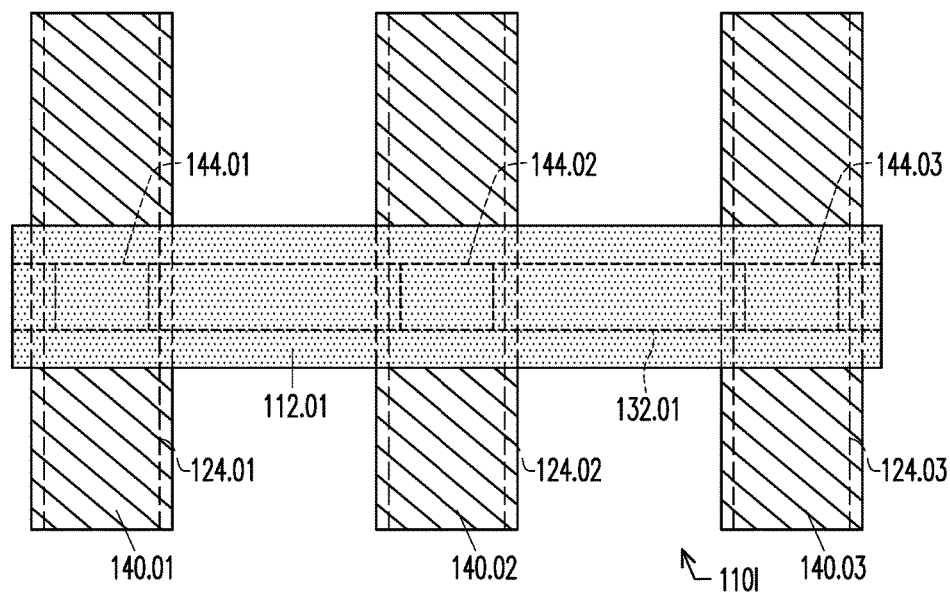
FIG. 1I is a layout diagram of a standard array, in accordance with some embodiments.

FIG. 1I is a layout diagram of a standard array 110I, in accordance with some embodiments.

In FIG. 1I, standard first array 110I is similar to standard first array 110H of FIG. 1H. However, standard first array 110I differs from standard first array 110H in that standard first array 110I includes three (rather than four) parallel segments 140.01-140.03 of the M(3) metallization layer correspondingly disposed on and connected to three (rather than four) vias 136.01-136.03. In some embodiments, the ratio p(M(1))/w(M(1))≈3.

Figure 1J:
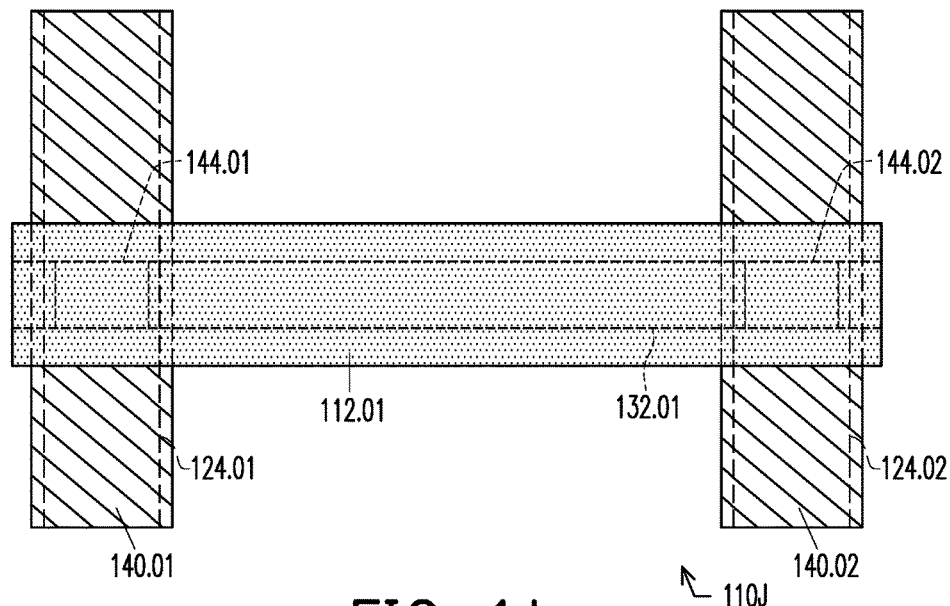
FIG. 1J is a layout diagram of a standard array, in accordance with some embodiments.

FIG. 1J is a layout diagram of a standard array 110J, in accordance with some embodiments.

In FIG. 1J, standard first array 110J is similar to standard first array 110I of FIG. 1I. However, standard first array 110J differs from standard first array 110I in that standard first array 110I includes two (rather than three) parallel segments 140.01-140.02 of the M(3) metallization layer correspondingly disposed on and connected to two (rather than three) vias 136.01-136.02. In some embodiments, the ratio p(M(1))/w(M(1))≈6.

FIGS. 1K-1Q are layout diagrams of corresponding standard second arrays 148K-148Q, in accordance with some embodiments. Standard second arrays 148K-148P of corresponding FIGS. 1K-1P are inchoate versions of standard second array 148Q of FIG. 1Q.

Figure 1K:
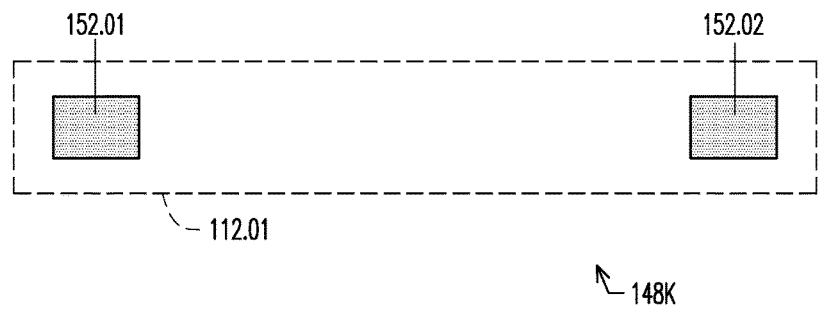
FIGS. 1K-1Q are layout diagrams of corresponding standard second arrays, in accordance with some embodiments.

In FIG. 1K, standard second array 148K includes vias 152.01-152.02. As a frame of reference, vias 152.01-152.02 are shown in relation to first segment 112.01 of the M(4) metallization layer. First segment 112.01 of the M(4) metallization layer is shown in phantom lines because first segment 112.01 of the M(4) metallization layer is not included in standard second array 148K.

Figure 1L:
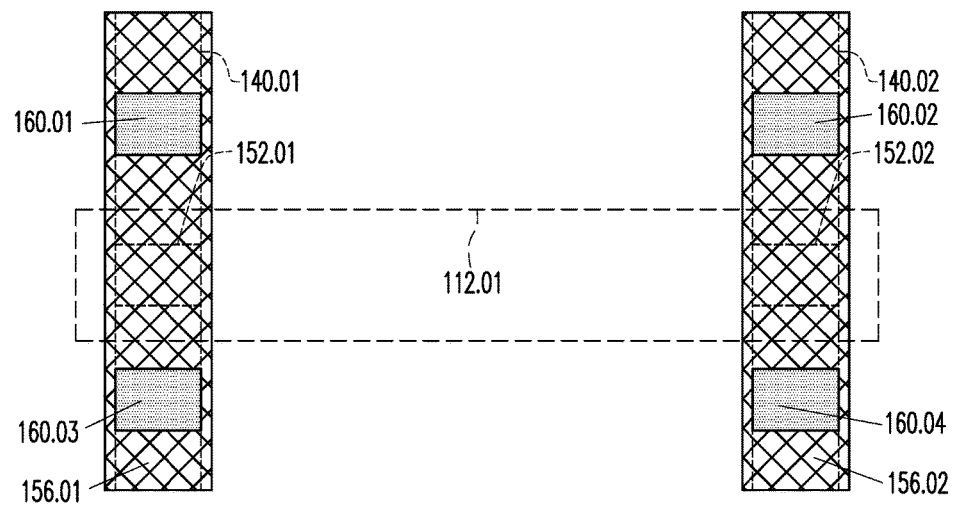

In FIG. 1L, standard second array 148L includes parallel segments 156.01-156.02 of the M(5) metallization layer correspondingly disposed on and connected to vias 152.01-152.02. Standard second array 148L further includes: vias 160.01 and 160.03 correspondingly disposed on and connected to segment 156.01 of the M(5) metallization layer, and vias 160.02 and 160.04 correspondingly disposed on and connected to segment 156.02 of the M(5) metallization layer. As a frame of reference, segments 140.01-140.02 of the M(3) metallization layer are shown in underlying relation to corresponding segments 156.01 and 156.02 of the M(5) metallization layer. Segments 140.01-140.02 of the M(3) metallization layer are shown in phantom lines because segments 140.01-140.02 of the M(3) metallization layer are not included in standard second array 148L (or standard second array 148K). In some embodiments, w(M(3))<w(M(5)). In some embodiments, a ratio of w(M(3)):w(M(5)) is about 0.63 such that if X=w(M(3))/w(M(5)), then X≈0.63. In some embodiments, w(M(5))≈w(M(4)). In some embodiments, a ratio of a pitch of segments 156.01-156.02 of the M(5) metallization layer, p(M(5)), to a width of each of segments 156.01-156.02 of the M(5) metallization layer, w(M(5)), is about 2 such that if X=p(M(5))/w(M(5)), then X≈2.

Figure 1M:
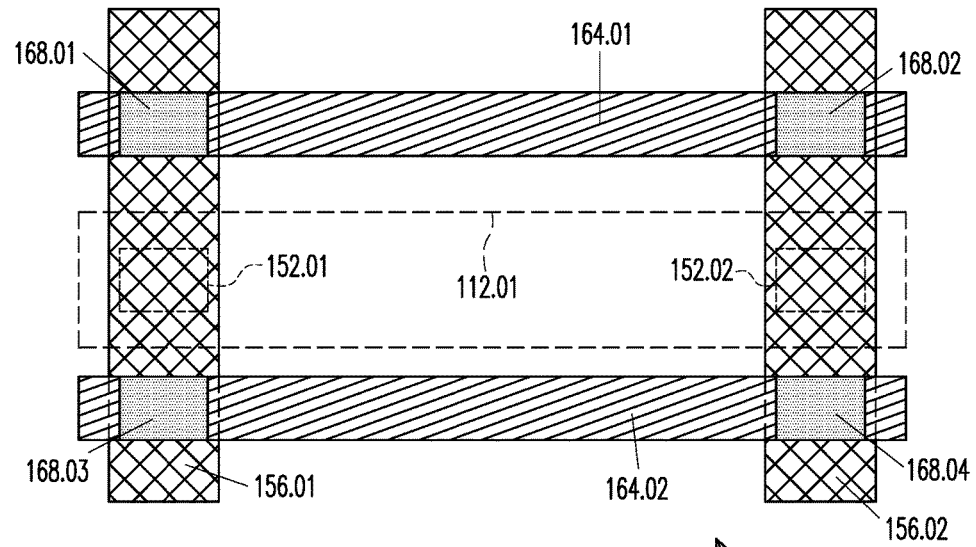

In FIG. 1M, standard second array 148M includes: a segment 164.01 of the M(6) metallization layer correspondingly disposed on and connected to vias 160.01 and 160.02; and a segment 164.02 of the M(6) metallization layer correspondingly disposed on and connected to vias 160.03 and 160.04. Segments 164.01 and 164.02 are parallel. Standard second array 148M further includes: vias 168.01 and 168.03 correspondingly disposed on and connected to segment 164.01 of the M(6) metallization layer; and vias 168.02 and 168.04 correspondingly disposed on and connected to segment 164.02 of the M(6) metallization layer. In some embodiments, w(M(6))<w(M(5)). In some embodiments, a ratio of w(M(6)):w(M(5)) is about 1 such that if X=w(M(6))/w(M(5)), then X≈1. In some embodiments, w(M(6))<w(M(7)). In some embodiments, a ratio of w(M(6)):w(M(7)) is about 1 such that if X=w(M(6))/w(M(7)), then X≈1. In some embodiments, a ratio of a pitch of segments 164.01-164.02 of the M(6) metallization layer, p(M(6)), to a width of each of segments 164.01-164.02 of the M(6) metallization layer, w(M(6)), is about 2 such that if X=p(M(6))/w(M(6)), then X≈2.

Figure 1N:
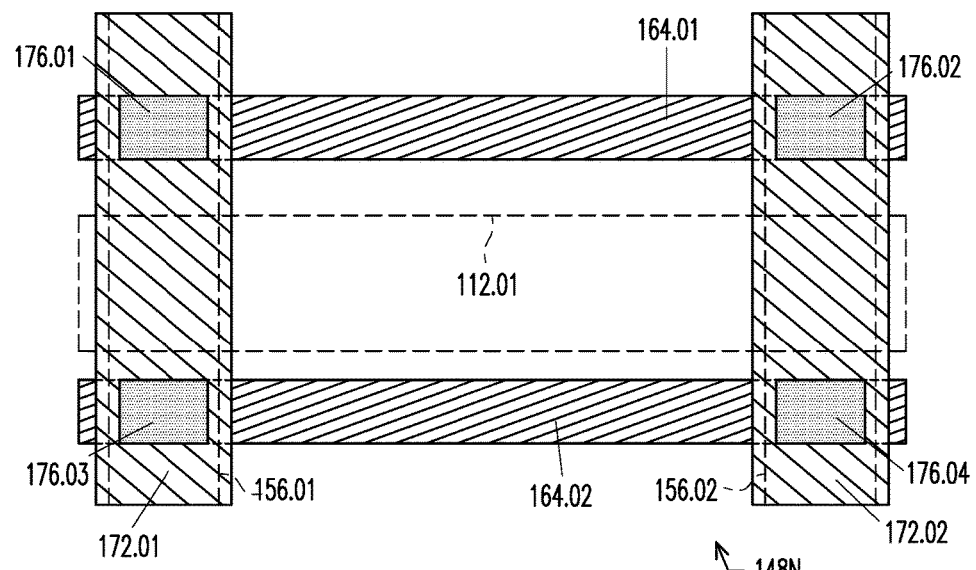

In FIG. 1N, standard second array 148N includes: segment 172.01 of the M(7) metallization layer correspondingly disposed on and connected to vias 168.01 and 168.03; and a segment 172.02 of the M(7) metallization layer correspondingly disposed on and connected to vias 168.02 and 168.04. Segments 172.01 and 172.02 are parallel. Standard second array 148N further includes: vias 176.01 and 176.03 correspondingly disposed on and connected to segment 172.01 of the M(6) metallization layer; and vias 176.02 and 176.04 correspondingly disposed on and connected to segment 172.02 of the M(6) metallization layer. In some embodiments, w(M(5))≈w(M(7)). In some embodiments, w(M(6))≈w(M(4)).

Figure 1O:
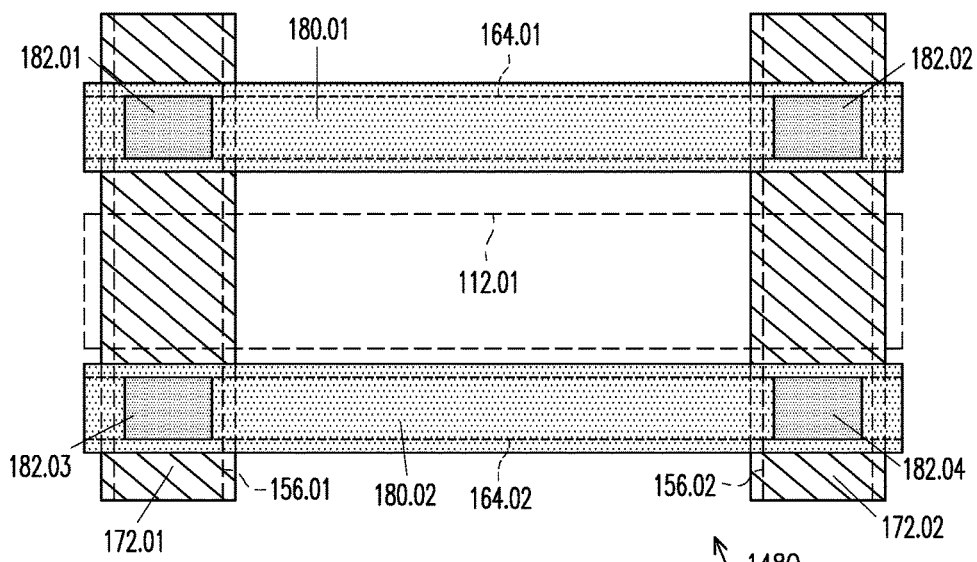

In FIG. 1O, standard second array 148O includes: a segment 180.01 of the M(8) metallization layer correspondingly disposed on and connected to vias 176.01 and 176.03; and a segment 180.02 of the M(8) metallization layer correspondingly disposed on and connected to vias 176.02 and 176.04. Segments 180.01 and 180.02 are parallel. Standard second array 148O further includes: vias 182.01 and 182.02 correspondingly disposed on and connected to segment 180.01 of the M(8) metallization layer; and vias 176.03 and 176.04 correspondingly disposed on and connected to segment 180.02 of the M(8) metallization layer. In some embodiments, w(M(6)) w(M(8)). In some embodiments, w(M(8))<w(M(7)). In some embodiments, a ratio of w(M(8)):w(M(7)) is about 1 such that if X=w(M(8))/w(M(7)), then X≈1.

Figure 1P:
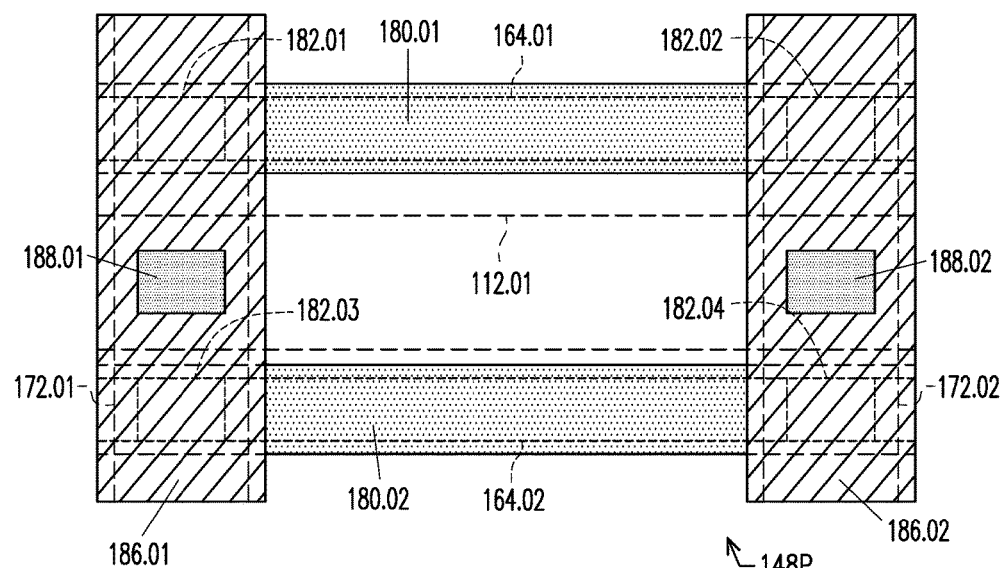

In FIG. 1P, standard second array 148P includes: a segment 186.01 of an M(9) metallization layer correspondingly disposed on and connected to vias 182.01 and 182.03; and a segment 186.02 of the M(9) metallization layer correspondingly disposed on and connected to vias 182.02 and 182.04. Segments 186.01 and 186.02 are parallel. Standard second array 148P further includes: vias 188.01 and 188.02 correspondingly disposed on and connected to segments 186.01 and 186.02 of the M(9) metallization layer. In some embodiments, w(M(7))<w(M(9)). In some embodiments a ratio is w(M(7))/w(M(9))≈0.6. In some embodiments, w(M(8))<w(M(9)). In some embodiments, a ratio of w(M(8)):w(M(9)) is about 0.61 such that if X=w(M(8))/w(M(9)), then X≈0.61.

Figure 1Q:
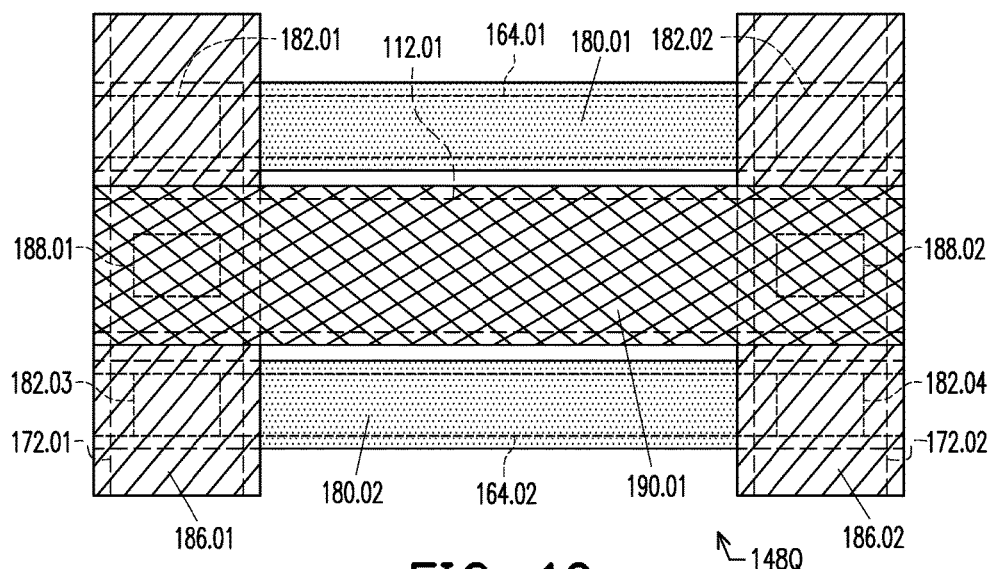

In FIG. 1Q, standard second array 148Q includes: a segment 190.01 of an M(10) metallization layer correspondingly disposed on and connected to vias 188.01 and 188.02. In some embodiments, w(M(8))<w(M(10)). In some embodiments, a ratio of w(M(8)):w(M(10)) is about 0.61 such that if X=w(M(8))/w(M(10)), then X≈0.61. In some embodiments, w(M(9)) w(M(10)). In some embodiments, a ratio is w(M(4))/w(M(10))≈0.6. In some embodiments, a ratio is w(M(6))/w(M(10))≈0.6.

Figure 1R:
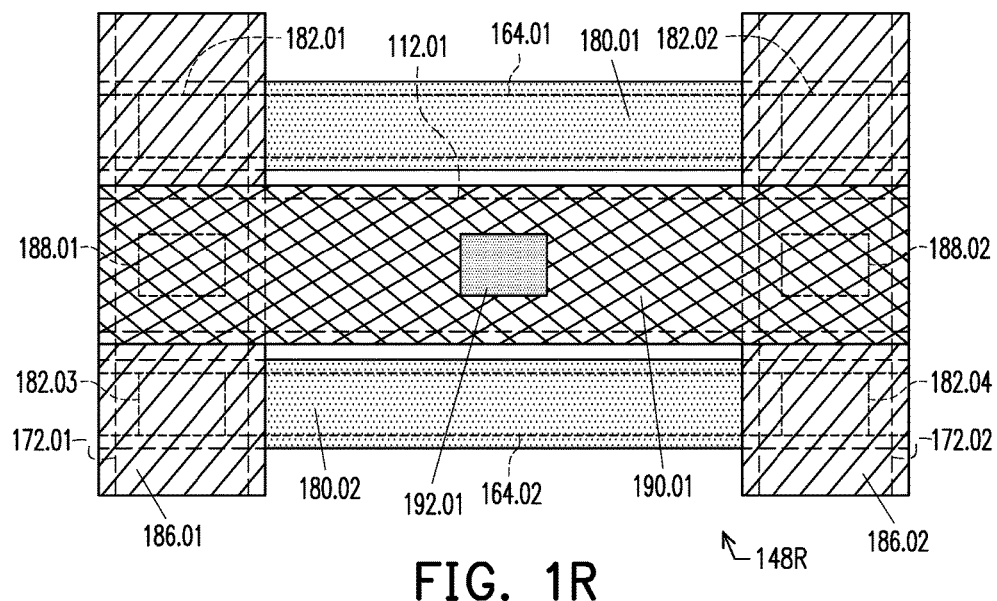
FIGS. 1R-1S are layout diagrams of corresponding standard second arrays, in accordance with some embodiments.
Figure 1S:
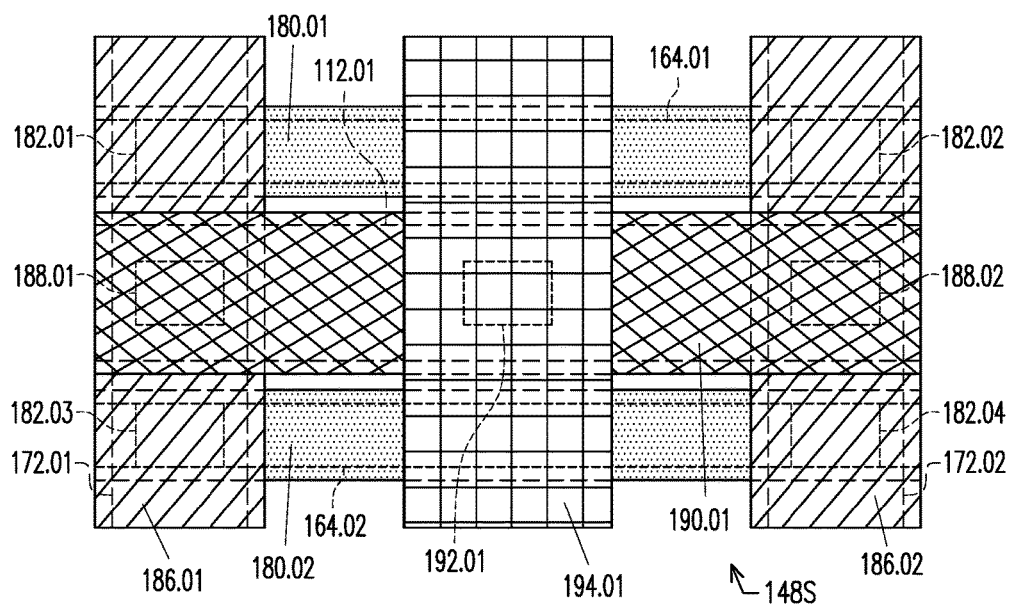

FIGS. 1R-1S are layout diagrams of corresponding standard second arrays 148R-148S, in accordance with some embodiments. Standard second array 148R of corresponding FIG. 1R is an inchoate version of standard second array 148S of FIG. 1S.

In FIG. 1R, standard second array 148R includes a via 192.01 disposed on and connected to segment 190.01 of an M(10) metallization layer.

In FIG. 1S, standard second array 148S includes a segment 194.01 of an M(11) metallization layer disposed on and connected to via 192.01. In some embodiments, w(M(9))<w(M(11)). In some embodiments, a ratio of w(M(9)):w(M(11)) is about 0.17 such that if X=w(M(9))/w(M(11)), then X≈0.17. In some embodiments, w(M(10))<w(M(11)). In some embodiments, a ratio of w(M(10)):w(M(11)) is about 0.17 such that if X=w(M(10))/w(M(11)), then X≈0.17.

Figure 1T:
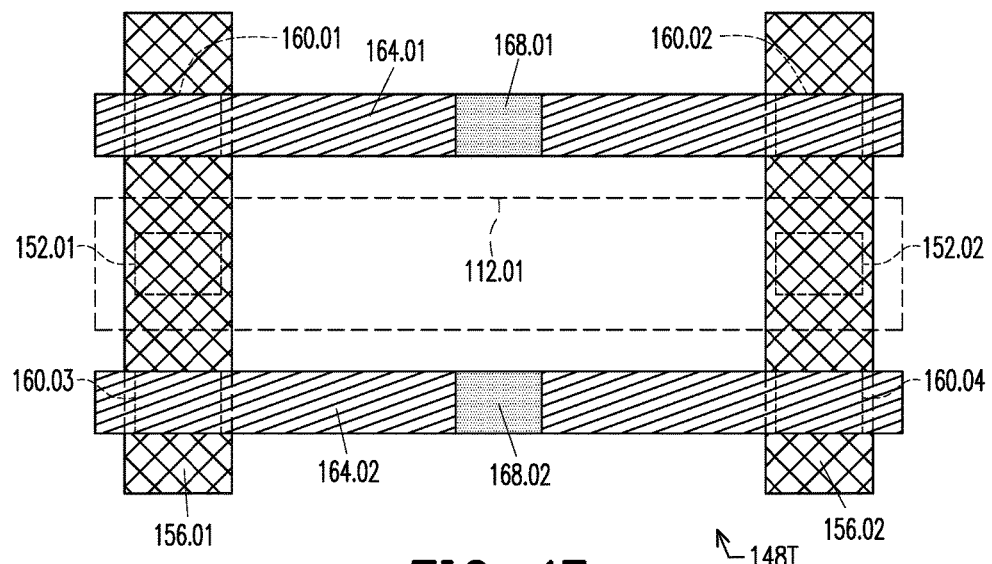
FIGS. 1T-1U are layout diagrams of corresponding standard second arrays, in accordance with some embodiments.
Figure 1U:
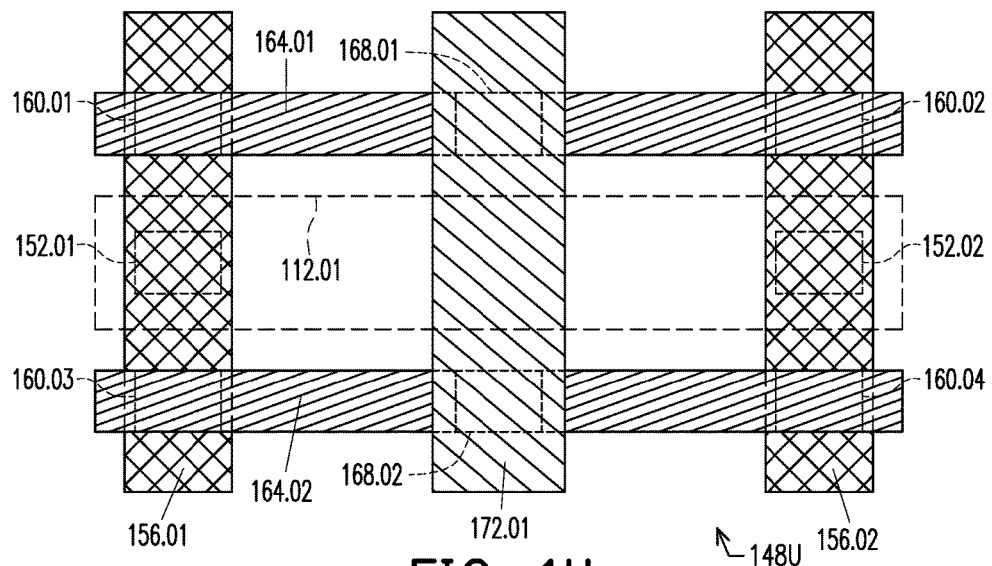

FIGS. 1T-1U are layout diagrams of corresponding standard second arrays 148T-148U, in accordance with some embodiments. Standard second array 148T of corresponding FIG. 1T is an inchoate version of standard second array 148U of FIG. 1U.

Standard second array 148T of FIG. 1T is similar to standard second array 148M of FIG. 1M in that standard second array 148T of FIG. 1T adds structures to standard second array 148L of FIG. 1L. However, in contrast to standard second array 148M of FIG. 1M, standard second array 148T of FIG. 1T includes: a segment 164.01 of the M(6) metallization layer correspondingly disposed on and connected to vias 160.01 and 160.02; and a segment 164.02 of the M(6) metallization layer correspondingly disposed on and connected to vias 160.03 and 160.04. Segments 164.01 and 164.02 are parallel. Standard second array 148T further includes vias 168.01 and 168.02 correspondingly disposed on and connected to segments 164.01 and 164.02 of the M(6) metallization layer.

In FIG. 1U, standard second array 148U includes a segment 172.01 of the M(7) metallization layer correspondingly disposed on and connected to vias 168.01 and 168.02.

Figure 1V:
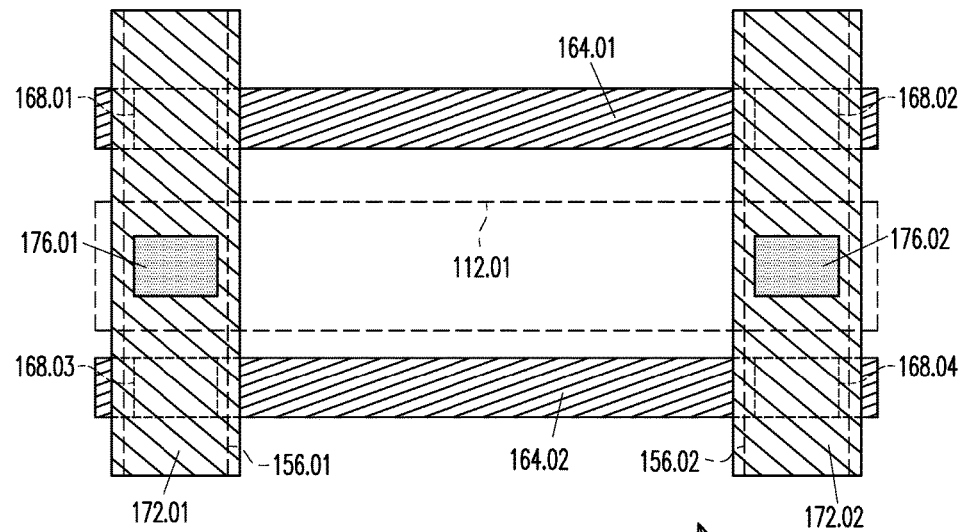
FIGS. 1V-1W are layout diagrams of corresponding standard second arrays, in accordance with some embodiments.
Figure 1W:
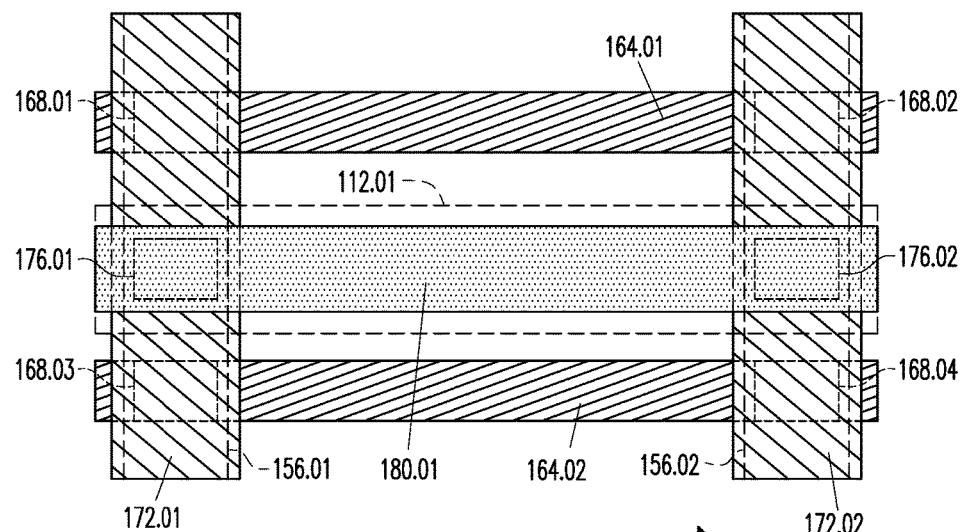

FIGS. 1V-1W are layout diagrams of corresponding standard second arrays 148V-148W, in accordance with some embodiments. Standard second array 148V of corresponding FIG. 1V is an inchoate version of standard second array 148W of FIG. 1W.

Standard second array 148V of FIG. 1V is similar to standard second array 148N of FIG. 1N in that standard second array 148V of FIG. 1V adds structures to standard second array 148M of FIG. 1M. However, in contrast to standard second array 148N of FIG. 1N, standard second array 148V of FIG. 1V includes: a segment 172.01 of the M(7) metallization layer correspondingly disposed on and connected to vias 168.01 and 160.03; and a segment 172.02 of the M(7) metallization layer correspondingly disposed on and connected to vias 160.02 and 160.04. Segments 172.01 and 172.02 are parallel. Standard second array 148V further includes: vias 176.01 and 176.02 correspondingly disposed on and connected to segments 172.01 and 172.02 of the M(7) metallization layer.

In FIG. 1W, standard second array 148W includes a segment 180.01 of the M(8) metallization layer correspondingly disposed on and connected to vias 176.01 and 176.02.

Figure 1X:
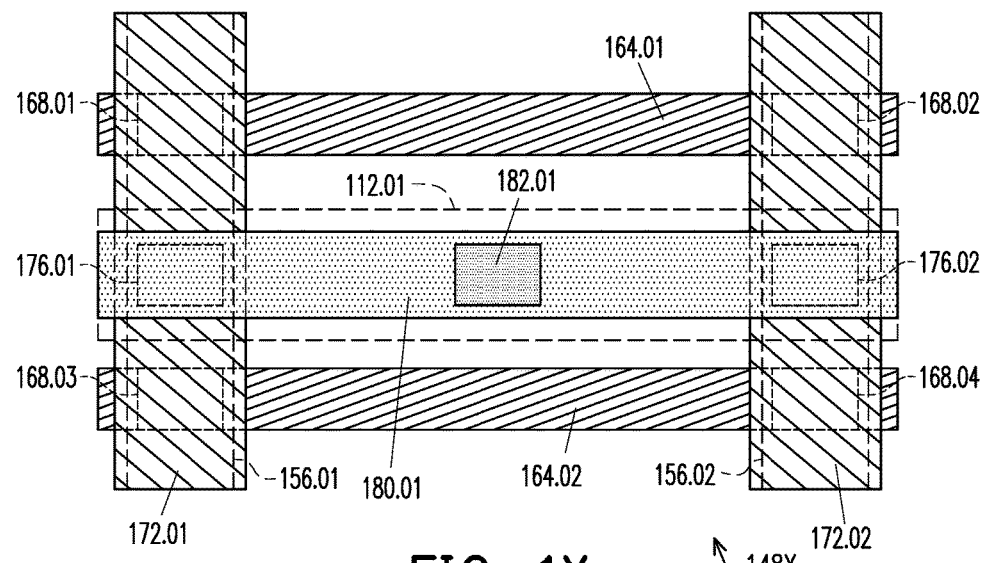
FIGS. 1X-1Y are layout diagrams of corresponding standard second arrays, in accordance with some embodiments.
Figure 1Y:
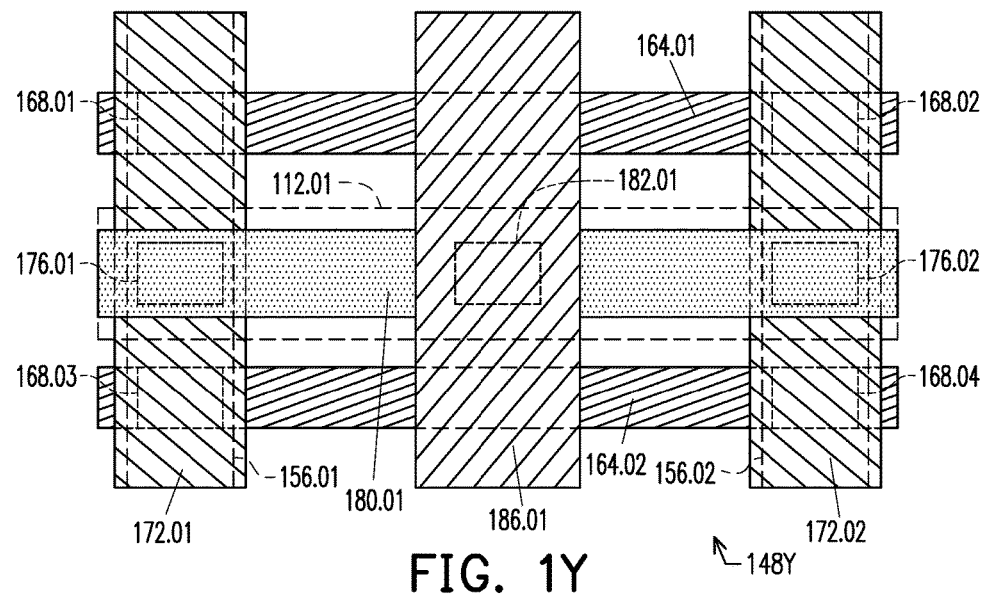

FIGS. 1X-1Y are layout diagrams of corresponding standard second arrays 148X-148Y, in accordance with some embodiments. Standard second array 148X of corresponding FIG. 1X is an inchoate version of standard second array 148Y of FIG. 1Y.

Standard second array 148X of FIG. 1X adds structures to standard second array 148W of FIG. 1W. In FIG. 1X, standard second array 148X of FIG. 1X includes: a via 182.01 disposed on and connected to segment 180.01 of the M(8) metallization layer.

In FIG. 1Y, standard second array 148Y includes: a segment 186.01 of the M(9) metallization layer correspondingly disposed on and connected to via 182.01.

FIGS. 1Z1-1Z2 are layout diagrams of corresponding standard second arrays 148Z1-148Z2, in accordance with some embodiments. Standard second array 148Z1 of corresponding FIG. 1Z1 is an inchoate version of standard second array 148Z2 of FIG. 1Z2.

Standard second array 148Z1 of FIG. 1Z1 is similar to standard second array 148O of FIG. 1O in that standard second array 148Z1 of FIG. 1Z1 adds structures to standard second array 148N of FIG. 1N. However, in contrast to standard second array 148O of FIG. 1O, standard second array 148Z1 of FIG. 1Z1 includes: a segment 180.01 of the M(8) metallization layer correspondingly disposed on and connected to vias 176.01 and 176.02; and a segment 180.02 of the M(8) metallization layer correspondingly disposed on and connected to vias 176.03 and 176.04. Segments 180.01 and 180.02 are parallel. Standard second array 148Z1 further includes: vias 182.01 and 182.02 correspondingly disposed on and connected to segments 180.01 and 180.02 of the M(8) metallization layer.

In FIG. 1Z2, standard second array 148Z2 includes a segment 186.01 of the M(9) metallization layer correspondingly disposed on and connected to vias 182.01 and 182.02.

In some embodiments, the number of configurations for instances of standard first array 110 are reduced to facilitate packing of cells. More particularly, the number of configurations for first segments (e.g., 112.01-112.03) of the M(4)

metallization layer is reduced in terms of permutations and combinations of (A) the number of first segments (e.g., 112.01-112.03) of the M(4) metallization layer and (B) the location of first segments (e.g., 112.01-112.03) of the M(4) metallization layer within the plane of the of the M(4) metallization layer. Reducing the number of configurations for first segments (e.g., 112.01-112.03) of the M(4) metallization layer consequently reduces the number of corresponding configurations for vias (e.g., 152.01-152.03) correspondingly disposed on and connected to first segments (e.g., 112.01-112.03) of the M(4) metallization layer. With fewer configurations for first segments (e.g., 112.01-112.03) of the M(4) metallization layer and consequently fewer corresponding configurations for vias (e.g., 152.01-152.03), the selection of a configuration for vias (e.g., 152.01-152.03) which is appropriate to a given configuration of first segments (e.g., 112.01-112.03) of the M(4) metallization layer becomes simpler such that the selection can be made more quickly, thereby facilitating the packing of cells.

Similarly, in some embodiments, the number of configurations for instances of standard first array 148 are reduced to facilitate packing of cells. More particularly, the number of configurations for first segments (e.g., 180.01-180.03) of the M(8) metallization layer is reduced in terms of permutations and combinations of (A) the number of first segments (180.01-180.03) of the M(8) metallization layer and (B) the location of first segments (180.01-180.03) of the M(8) metallization layer within the plane of the of the M(8) metallization layer. Reducing the number of configurations for first segments (e.g., 180.01-180.03) of the M(8) metallization layer consequently reduces the number of corresponding configurations for overlying vias (not shown) correspondingly disposed on and connected to first segments (e.g., 180.01-180.03) of the M(8) metallization layer. With fewer configurations for first segments (e.g., 180.01-180.03) of the M(8) metallization layer and consequently fewer corresponding configurations for the overlying vias, the selection of a configuration for the overlying vias which is appropriate to a given configuration of first segments (e.g., 180.01-180.03) of the M(8) metallization layer becomes simpler such that the selection can be made more quickly, thereby facilitating the packing of cells.

Figure 2A:
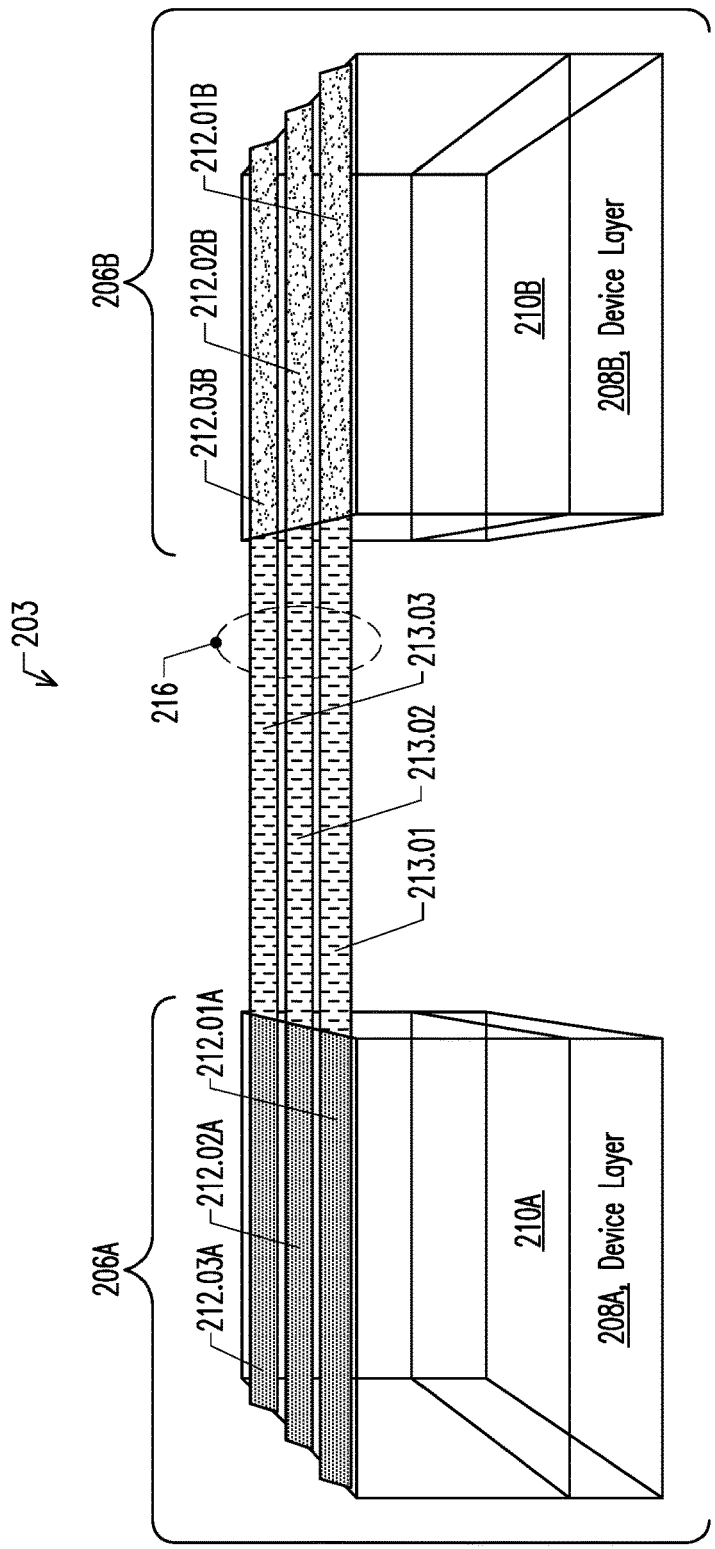
FIG. 2A is a three-quarter perspective drawing of two uncrowned standard cells connected together for a semiconductor device, in accordance with some embodiments.

FIG. 2A is a three-quarter perspective drawing of two uncrowned standard cells 206A-206B connected together for a semiconductor device, in accordance with some embodiments.

In FIG. 2A, uncrowned standard cells 206A and 206B are similar to uncrowned standard cells 106. Hence, uncrowned standard cells 206A and 206B include corresponding first segments 212.01A-212.03A and 212.01B-212.03B of the M(4) metallization layer. To achieve a connection between corresponding uncrowned standard cells 206A and 206B, FIG. 2A further includes a bundle 216 of second segments 213.01-213.03 of the M(4) metallization layer. Second segments 213.01-213.03 directly connect corresponding first segments 212.01A-212.03A and 212.01B-212.03B of the M(4) metallization layer in standard first arrays 210A and 210B, and thereby connect the corresponding uncrowned standard cells 206A and 206B as an uncrowned pair 203.

In some embodiments, as between a given uncrowned pair (of connected uncrowned standard cells 206A and 206B), fewer than all of second segments 213.01-213.03 may be used to connect together crowned standard cells 206A and 206B. In some embodiments, a layout will include a population of uncrowned pairs (of connected corresponding uncrowned standard cells 206A and 206B). Amongst the population of uncrowned pairs (of connected corresponding uncrowned standard cells 206A and 206B), the number of second segments 213.01-213.03 used to connect together any given uncrowned pair (of connected corresponding uncrowned standard cells 206A and 206B) will vary depending upon the internal arrangements of each of the corresponding crowned standard cells 206A and 206B.

Similar to FIG. 1A, for simplicity, in FIG. 2A, each of the M(1)~M(4) metallization layers is shown as including 3 segments. Other numbers of segments in the M(1)~M(4) metallization layers, and more generally in the M(1)~M(N) metallization layers, are contemplated. In some embodiments, space/volume between uncrowned standard cells 206A and 206B not otherwise occupied by segments of a metallization layer are filled with a dielectric (for simplicity, not shown in FIG. 2A).

Figure 2B:
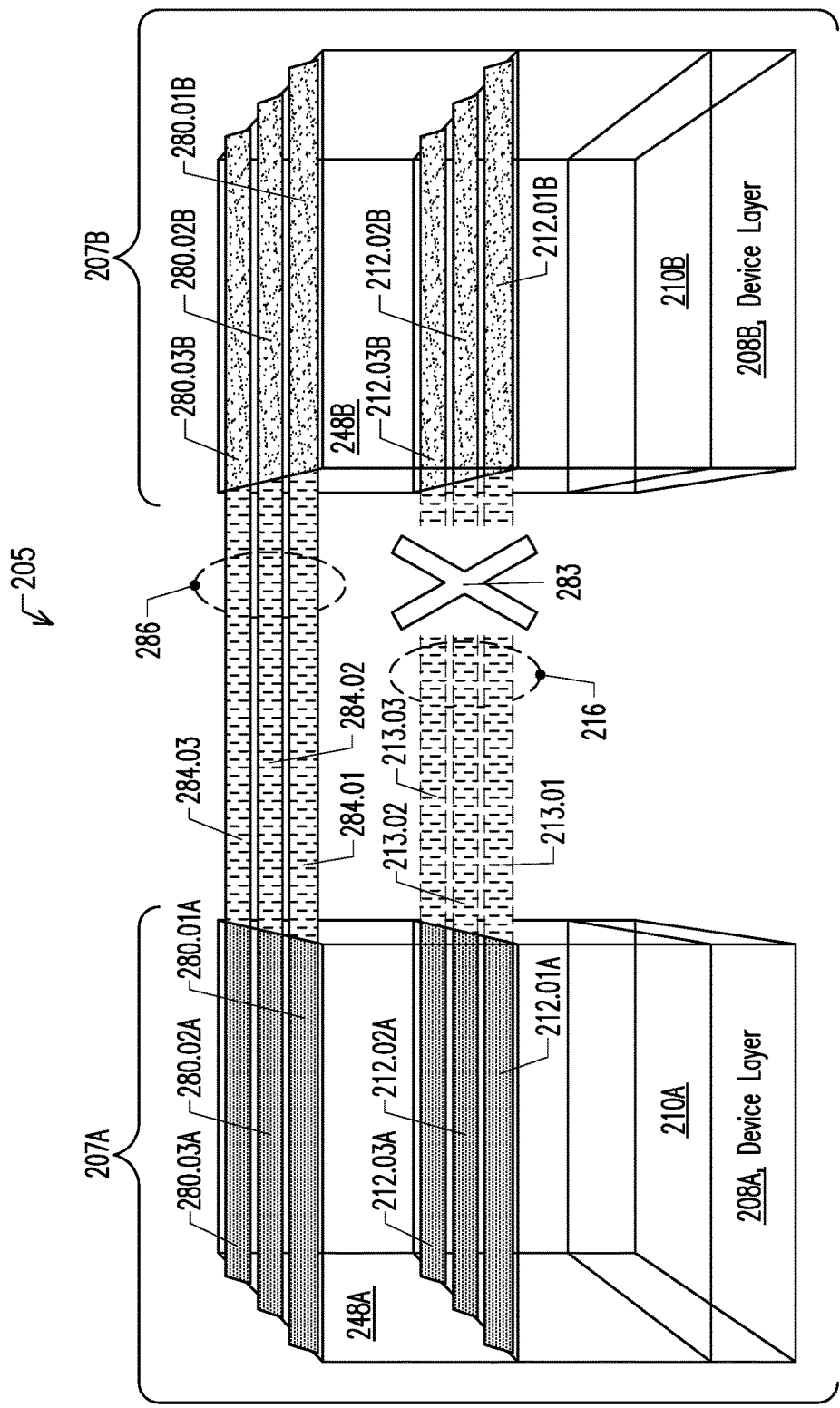
FIG. 2B is a three-quarter perspective drawing of two crowned standard cells connected together for a semiconductor device, in accordance with some embodiments.

FIG. 2B is a three-quarter perspective drawing of two crowned standard cells 207A and 207B connected together for a semiconductor device, in accordance with some embodiments.

In FIG. 2B, crowned standard cells 207A and 207B include corresponding first segments 280.01A-280.03A and 280.01B-280.03B of the M(8) metallization layer. Also in FIG. 2A, second segments 213.01-213.03 of the M(4) metallization layer have been disconnected as indicated by cut symbol 283. Consequently, corresponding first segments 212.01A-212.03A and 212.01B-212.03B of the M(4) metallization layer in standard first arrays 210A and 210B are no longer directly connected. In some embodiments, second segments 213.01-213.03 of the M(4) metallization layer are removed from the layout.

In FIG. 2B, as example circumstances, it is assumed that bundle 216 has been subjected to testing, resulting in test data, and it is further assumed that the test data has been compared to quality-assessment criteria (in terms, e.g., of signal propagation delay such as the resistive-capacitive (RC) delay, electromigration susceptibility/degradation, or the like). Regarding the example circumstances of FIG. 2B, it is yet further assumed that the comparison of the test data to the quality-assessment criteria has revealed that bundle 216 is underperforming. As such, underperforming bundle 216 has been disconnected as indicated by cut symbol 283.

To achieve a connection between corresponding crowned standard cells 207A and 207B, FIG. 2B further includes a bundle 286 of second segments 284.01-284.03 of the M(8) metallization layer. Second segments 284.01-284.03 directly connect corresponding first segments 280.01A-280.03A and 280.01B-280.03B of the M(8) metallization layer in standard second arrays 248A and 248B, and thereby connect the corresponding crowned standard cells 207A and 207B as a crowned pair 205. Relative to the quality-assessment criteria, bundle 286 performs better than the formerly-connected bundle 216. In some embodiments, bundle 286 performs at least about 30% better than bundle 216.

For example, in some embodiments, N=4 and Q=4 such that the M(N) metallization layer is M(4) and the M(N+Q) metallization layer is M(8), bundle 216 is in (or 'routed through') the M(4) metallization layer, bundle 286 is in (or 'routed through') the M(8) metallization layer, second segments 213.01-213.03 of the M(4) metallization layer are narrower than second segments 284.01-284.03 of the M(8) metallization layer, and the M(4) metallization layer is more congested than the M(8) metallization layer such that the lengths of second segments 213.01-213.03 of bundle 216 are longer than the lengths of corresponding second segments 284.01-284.03 of bundle 286. Consequently, the aggregate RC delay for bundle 216, which is based on the RC delays of second segments 213.01-213.03 of the M(4) metallization layer, is greater than the aggregate RC delay of bundle 286, which is based on the RC delays of second segments 284.01-284.03 of the M(8) metallization layer. In some embodiments, where second segments 284.01-284.03 of the M(8) metallization layer are wider than second segments 213.01-213.03 of the M(4) metallization layer, second segments 284.01-284.03 of the M(8) metallization layer are less susceptible negative effects of electromigration than second segments 213.01-213.03 of the M(4) metallization layer.

In some embodiments, as between a given crowned pair (of connected crowned standard cells 207A and 207B), fewer than all of second segments 284.01-284.03 may be used to connect together crowned standard cells 207A and 207B. In some embodiments, a layout will include a population of crowned pairs (of connected corresponding crowned standard cells 207A and 207B). Amongst the population of crowned pairs (of connected corresponding crowned standard cells 207A and 207B), the number of second segments 284.01-284.03 used to connect together any given crowned pair (of connected corresponding crowned standard cells 207A and 207B) will vary depending upon the internal arrangements of each of the corresponding crowned standard cells 207A and 207B.

A combined population of uncrowned standard cells 206A and 206B and crowned standard cells 207A and 207B) will have a total number of members representing a sum of a subtotal number of uncrowned standard cells 206A and 206B and a subtotal number of crowned standard cells 207A and 207B. In some embodiments, the subtotal number of crowned standard cells 207A and 207B is less than about 50% of the total number of members in the combined population, such that the underperforming instances of bundle 216 (whose corresponding instances of uncrowned standard cells 206A-206B were subjected to reconfiguration) are regarded as being uncommon among all instances of bundle 216 and such that reconfiguration is regarded as having been selectively applied. Because the underperforming instances of bundle 216 are uncommon, the associated reconfigurations contribute less significantly to the worsening of layout-design problems such as overcrowding, routing-impossibility, or the like, than if a corresponding initial layout called for a 'global crowning' of all standard cells.

In some embodiments, subtotal number of crowned standard cells 207A and 207B) is less than about 1% of the total number of members in the combined population, such that the underperforming instances of bundle 216 (whose corresponding instances of uncrowned standard cells 206A-206B were subjected to reconfiguration) are regarded as being anomalous among all instances of bundle 216 and such that reconfiguration is regarded as having been more selectively applied. Because the underperforming instances of bundle 216 are anomalous, the associated reconfigurations contribute less significantly to the worsening of layout-design problems such as overcrowding, routing-impossibility, or the like, than if a corresponding initial layout called for a 'global crowning' of all standard cells.

Similar to FIG. 1C, for simplicity, in FIG. 2B, each of the M(5)~M(8) metallization layers is shown as including 3 segments. Other numbers of segments in the M(5)~M(8) metallization layers, and more generally in the M(N+1)~M(N+Q) metallization layers, are contemplated. In some embodiments, space/volume between crowned standard cells 207A and 207B not otherwise occupied by segments of a metallization layer are filled with a dielectric (for simplicity, not shown in FIG. 2B).

Figure 3A:
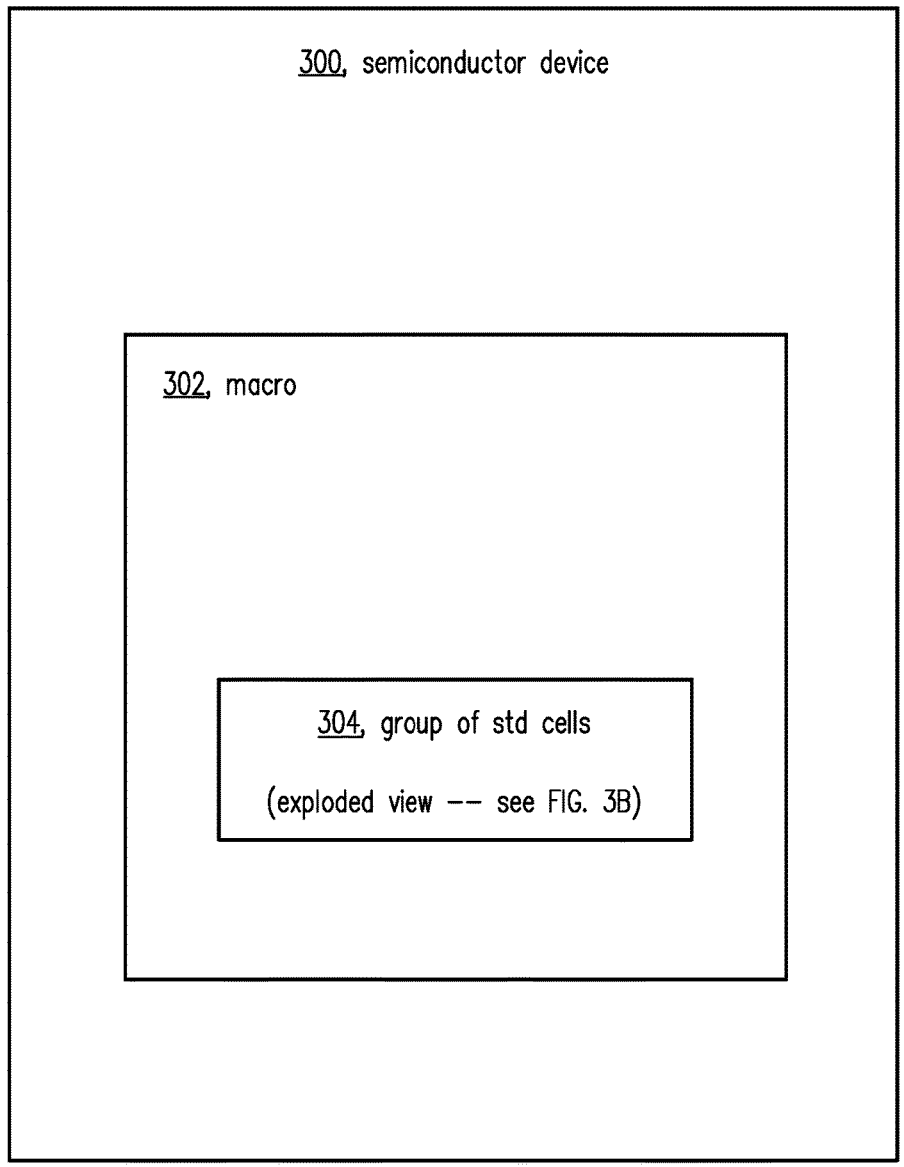
FIG. 3A is a block diagram of a semiconductor device, in accordance with some embodiments.

FIG. 3A is a block diagram of a semiconductor device 300, in accordance with some embodiments.

In some embodiments, semiconductor device 300 includes, among other things, a macro 302. In some embodiments, macro 302 is an SRAM macro. Macro 302 includes a group 304 of uncrowned standard cells. In some embodiments, group 304 includes uncrowned standard cells according to FIGS. 1A-1D and FIGS. 2A-2B.

Figure 3B:
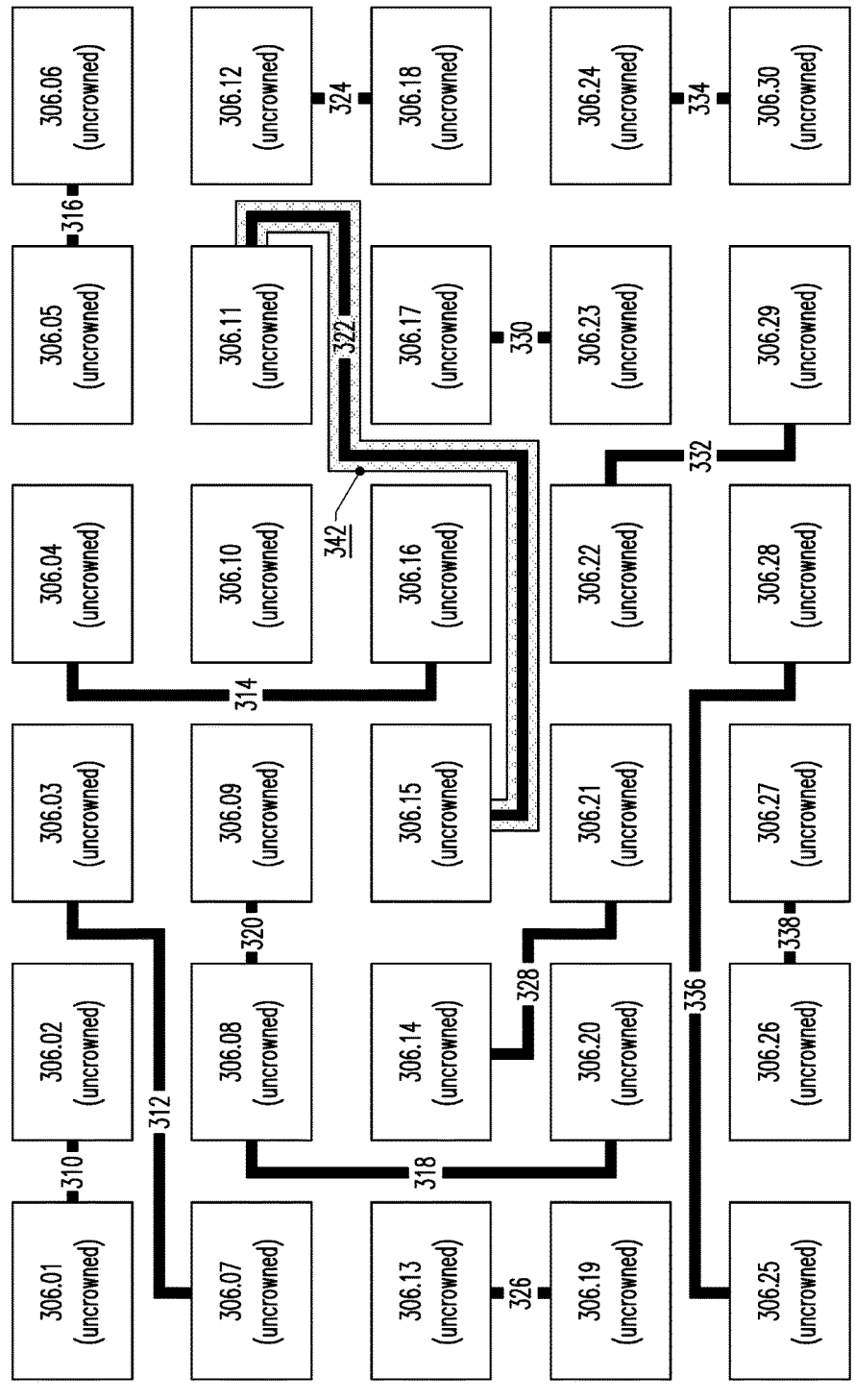
FIG. 3B is an exploded view of a group of uncrowned standard cells in FIG. 3A, in accordance with some embodiments.

FIG. 3B is an exploded view of group 304 of uncrowned standard cells 306.01-306.30 in FIG. 3A, in accordance with some embodiments.

In FIG. 3B, group 304 includes uncrowned standard cells 306.01-306.30 and bundles 310-338 of corresponding one or more second segments in the M(4) metallization layer. Uncrowned standard cells 306.01-306.30 are similar to uncrowned standard cells 106, 206A and 206B. Each of bundles 310-338 is similar to bundle 216. Hence, each of bundles 310-338 includes 3 segments. Other numbers of segments (not shown in FIG. 3B) in the M(4) metallization layer, and more generally in the M(N) metallization layer, are contemplated. In some embodiments, amongst bundles 310-338, the number of second segments 213.01-213.03 (not shown in FIG. 3B) used to connect together any given uncrowned pair of uncrowned standard cells 316.01-306.30, and thus any corresponding pair of standard first arrays 210A and 210B (not shown in FIG. 3B) will vary depending upon the internal arrangements of each uncrowned standard cell in the given uncrowned pair.

Uncrowned standard cell 306.01 is connected through bundle 310 to uncrowned standard cell 306.02. Uncrowned standard cell 306.03 is connected through bundle 312 to uncrowned standard cell 306.07. Uncrowned standard cell 306.04 is connected through bundle 314 to uncrowned standard cell 306.16. Uncrowned standard cell 306.05 is connected through bundle 316 to uncrowned standard cell 306.06. Uncrowned standard cell 306.08 is connected through bundle 318 to uncrowned standard cell 306.20. Uncrowned standard cell 306.08 also is connected through bundle 320 to uncrowned standard cell 306.09.

Uncrowned standard cell 306.10 is not connected through a bundle to another one of uncrowned standard cells 306.01-301.09 and 306.11-306.30.

Uncrowned standard cell 306.11 is connected through bundle 322 to uncrowned standard cell 306.15. Uncrowned standard cell 306.12 is connected through bundle 324 to uncrowned standard cell 306.18. Uncrowned standard cell 306.13 is connected through bundle 326 to uncrowned standard cell 306.19. Uncrowned standard cell 306.14 is connected through bundle 328 to uncrowned standard cell 306.21. Uncrowned standard cell 306.17 is connected through bundle 330 to uncrowned standard cell 306.23. Uncrowned standard cell 306.22 is connected through bundle 332 to uncrowned standard cell 306.29. Uncrowned standard cell 306.24 is connected through bundle 334 to uncrowned standard cell 306.30. Uncrowned standard cell 306.25 is connected through bundle 336 to uncrowned standard cell 306.28. Uncrowned standard cell 306.26 is connected through bundle 338 to uncrowned standard cell 306.28.

In FIG. 3B, a total number of uncrowned standard cells included in group 304 has been limited for simplicity of illustration. Other total numbers of uncrowned standard cells included in group 304 are contemplated. Similarly, the routing of bundles 310-338 in FIG. 3B has been selected for simplicity of illustration. Other routings of bundles 310-338 are contemplated. In other embodiments, uncrowned standard cell 306.10 is connected to another one of uncrowned standard cells 306.01-301.09 and 306.11-306.30. In some embodiments, one or more of uncrowned standard cells 306.01-306.30 other than uncrowned standard cell 306.10 is not connected to other ones of uncrowned standard cells 306.01-306.30. In some embodiments, one or more of uncrowned standard cells 306.01-306.30 is connected to corresponding other uncrowned standard cells outside of group 304. In some embodiments, one or more of uncrowned standard cells 306.01-306.30 is connected to corresponding custom cells outside of group 304.

Furthermore, in FIG. 3B, it is assumed that bundles 310-338 of corresponding one or more second segments (not shown in FIG. 3C) in the M(4) metallization layer have been subjected to testing, resulting in test data. It is further assumed that the test data has been compared to quality-assessment criteria (in terms, e.g., of signal propagation delay, electromigration susceptibility/degradation, or the like). It is yet further assumed that the comparison of the test data to the quality-assessment criteria has revealed that bundle 322 (of one or more second segments (not shown in FIG. 3C) in the M(4) metallization layer) which connects uncrowned standard cell 306.11 to uncrowned standard cell 306.15 is underperforming. As such, underperforming bundle 322 is called out in FIG. 3C by 'shadow' 342.

Figure 3C:
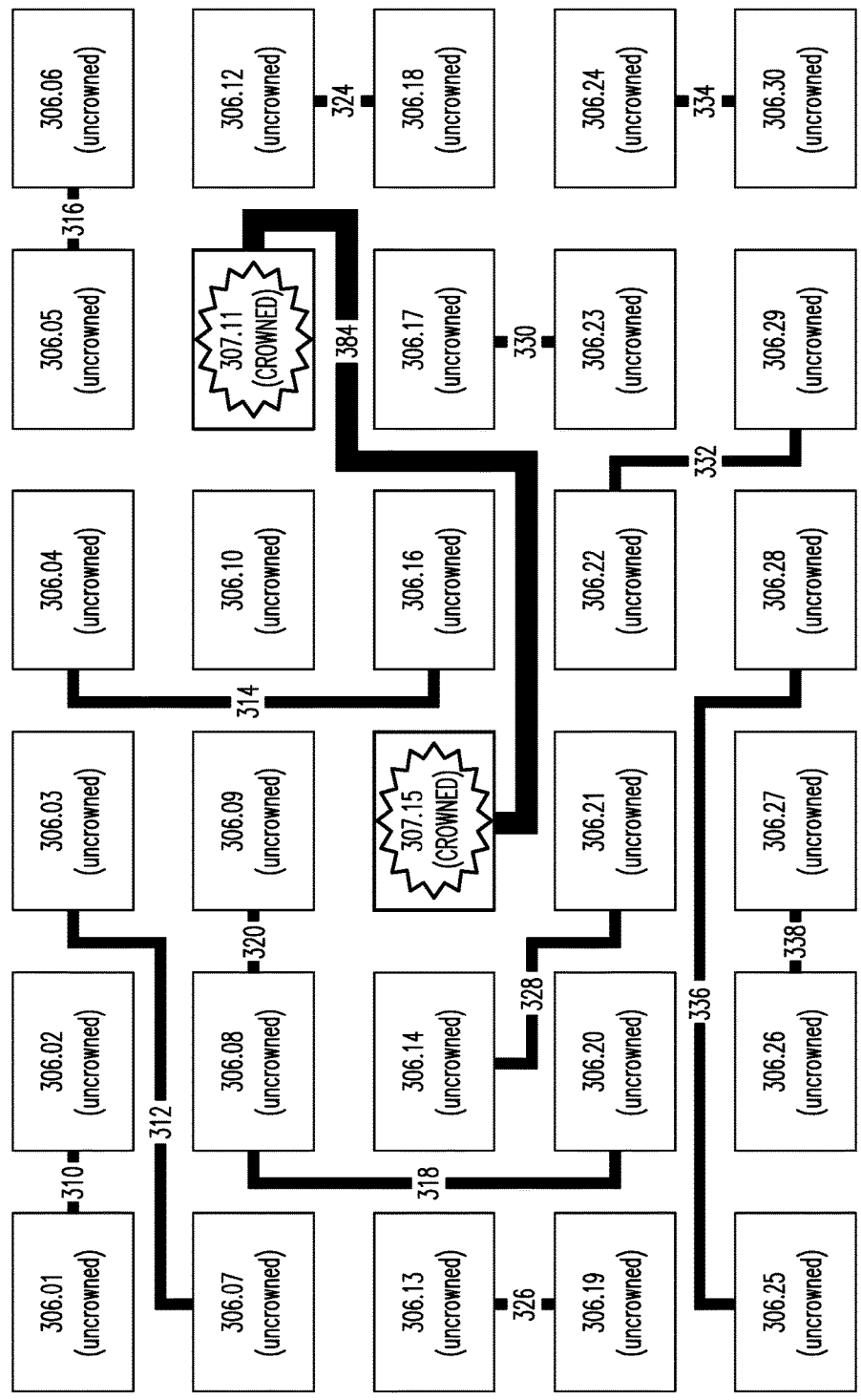
FIG. 3C is an exploded view of a revised group of uncrowned and crowned standard cells in FIG. 3A, in accordance with some embodiments.

FIG. 3C is an exploded view of a revised group 304' of uncrowned standard cells and crowned standard cells, in accordance with some embodiments.

In FIG. 3C, uncrowned standard cells 306.11 and 306.15 have been crowned resulting in corresponding crowned standard cells 307.11 and 307.15. Also, crowned standard cells 307.11 and 307.15 have been connected together with a bundle 384.

In more detail, in FIG. 3C, crowned standard cells 307.11 and 307.15 are similar to crowned standard cells 107, 207A and 207B. Bundle 384 is similar to bundle 286. Hence, bundle 384 includes 3 segments. Other numbers of segments (not shown in FIG. 3C) in the M(8) metallization layer, and more generally in the M(N+Q) metallization layer, are contemplated. In some embodiments, the number of second segments 284.01-284.03 (not shown in FIG. 3C) used to connect together standard second arrays 248A and 248B (not shown in FIG. 3C) of corresponding crowned standard cells 307.11 and 307.15 will vary depending upon the internal arrangements of each of the corresponding crowned standard cells 307.11 and 307.15.

In FIG. 3C, bundle 322 (not shown in FIG. 3C) has been disconnected such that corresponding first segments 212.01A-212.03A and 212.01B-212.03B (not shown in FIG. 3C) of the M(4) metallization layer in standard first arrays 210A-210B (not shown in FIG. 3C) of corresponding uncrowned standard cells 306.11 and 306.15 (not shown in FIG. 3C) are no longer directly connected. Standard second arrays 248A and 248B (not shown in FIG. 3C) have been added on corresponding standard first arrays 210A and 210B (not shown in FIG. 3C), resulting in corresponding crowned standard cells 307.11 and 307.15. Second segments 284.01-284.03 (not shown in FIG. 3C) of the M(8) metallization layer, representing bundle 384, have been added such that corresponding first segments 280.01A-280.03A and 280.01B-280.03B (not shown in FIG. 3C) of the M(8) metallization layer in standard second arrays 248A and 248B (not shown in FIG. 3C) of corresponding crowned standard cells 307.11 and 307.15 are directly connected, thereby resulting in a crowned pair. Relative to the quality-assessment criteria, bundle 384 performs better than the formerly-connected bundle 322.

Figure 4A:
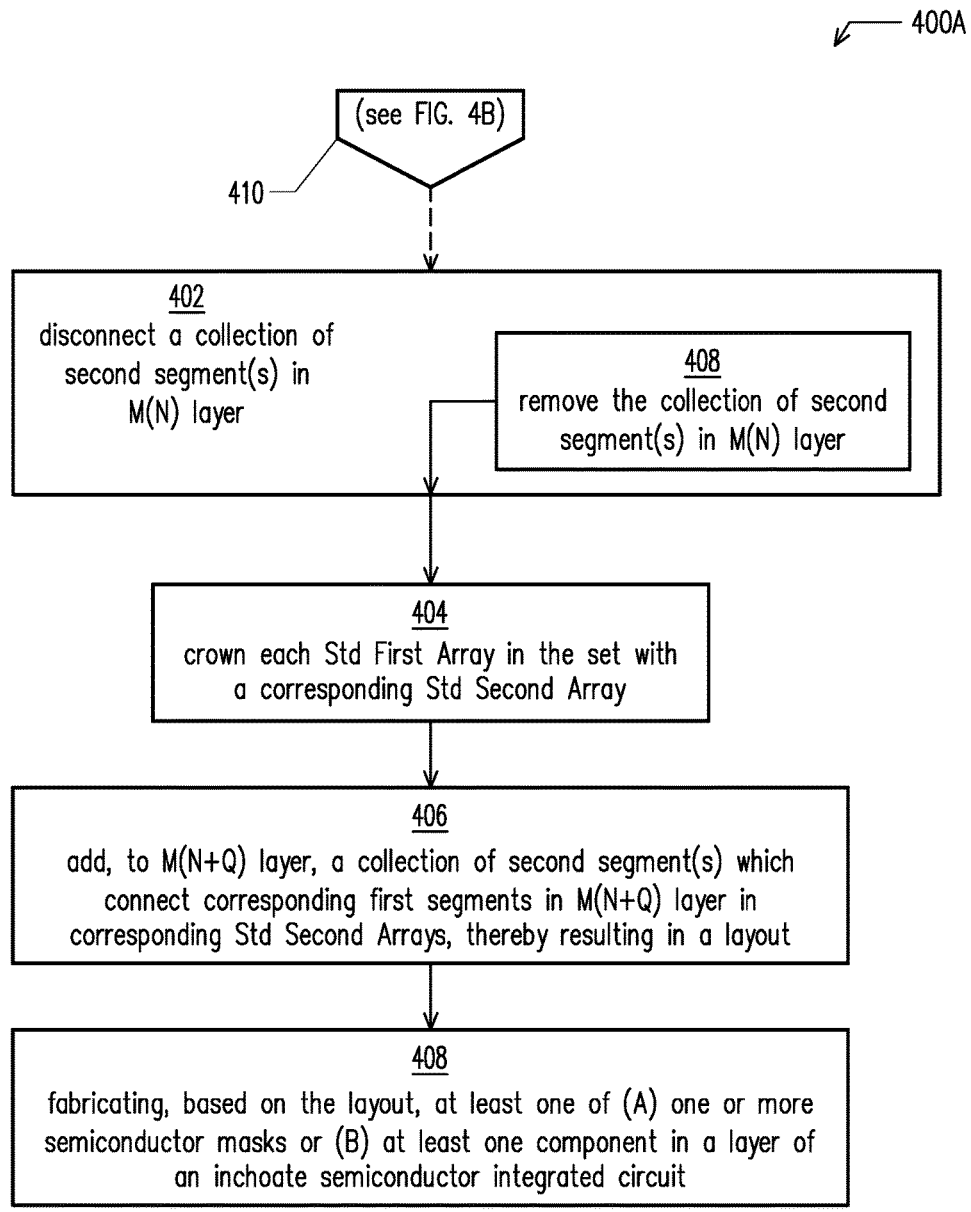
FIGS. 4A-4B are flowcharts of corresponding methods, in accordance with some embodiments.
Figure 4B:
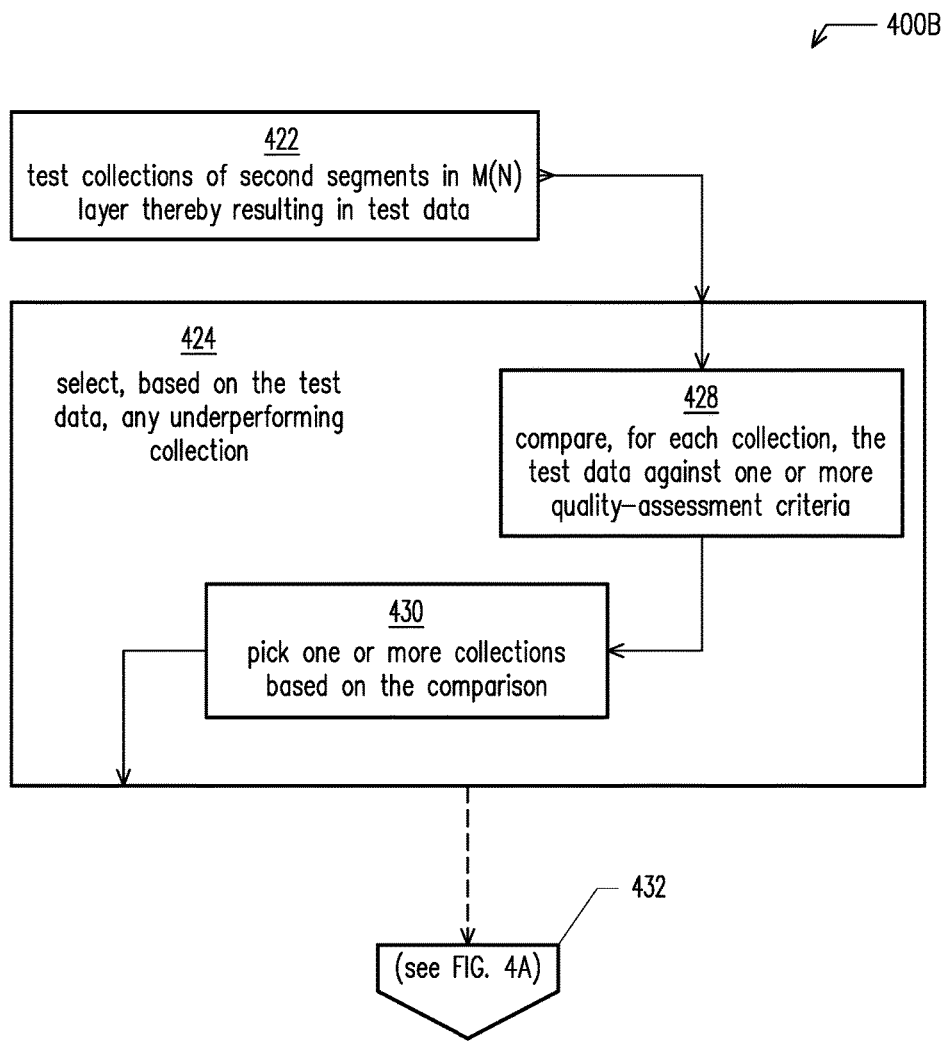

FIGS. 4A-4B are corresponding flowcharts 400A-400B of corresponding methods, in accordance with some embodiments.

FIGS. 4A-4B relate, e.g., to FIGS. 2A-2B in terms of how uncrowned pair 203 of uncrowned standard cells 206A-206B is reconfigured to be crowned pair 205 of crowned standard cells 207A-207B. In some embodiments, a flowchart 400B of FIG. 4B precedes a flowchart 400A of FIG. 4A, as indicated by a phantom (dashed) arrow between an 'off-page' symbol 410 in FIG. 4A and a block 402 in FIG. 4A.

In flowchart 400A of FIG. 4A, at block 402, for an uncrowned pair of uncrowned standard cells, a collection of one or more second segments in the M(N) layer (which otherwise connect together the uncrowned standard cells in the uncrowned pair) is disconnected. For example, the uncrowned pair of uncrowned standard cells correspond to uncrowned pair 203 of uncrowned standard cells 206A-206B, and the collection of one or more second segments in the M(N) layer corresponds to segments 213.01-213.03 in the M(4) metallization layer. In some embodiments, block 402 includes a block 408. At block 408, the collection of one or more second segments in the M(N) layer is removed. In some embodiments, block 402 does not include block 408. From block 408, flow proceeds to block 404.

At block 404, each standard first array in the corresponding uncrowned standard cells in the uncrowned pair is crowned with a standard second array. For example, the standard first arrays correspond to standard first arrays 210A-201B, and the standard second arrays correspond to standard second arrays 248A-248B. From block 404, flow proceeds to a block 406.

At block 406, a collection of second segments in the M(N+Q) metallization layer is added so as to connect corresponding first segments in the M(N+Q) metallization layer, the first segments in the M(N+Q) metallization layer being located in corresponding standard second arrays. For example, the M(N+Q) metallization layer is M(8), the collection of second segments in the M(N+Q) metallization layer corresponds to second segments 284.01-284.03 in the M(8) metallization layer, the first segments in the M(N+Q) metallization layer correspond to first segments 280.01A-280.03A (located in standard second array 248A) and first segments 280.01B-280.03B (located in standard second array 248B).

In some embodiments, as noted above, flowchart 400B of FIG. 4B precedes flowchart 400A of FIG. 4A, as indicated by a phantom (dashed) arrow between block 424 in FIG. 4B and an 'off-page' symbol 432 in FIG. 4B. In some embodiments, flowchart 400B assumes that there is a population of multiple uncrowned pairs of corresponding uncrowned standard cells.

In FIG. 4B, at block 422, for each uncrowned pair of uncrowned standard cells, the corresponding collection of one or more second segments in the M(N) layer (which connect together the uncrowned standard cells in the uncrowned pair) is tested, resulting in test data. For example, each of the uncrowned pairs of uncrowned standard cells is similar to uncrowned pair 203 of uncrowned standard cells 206A-206B, and each collection of one or more second segments in the M(N) layer (which connect together the corresponding standard second arrays of the uncrowned standard cells in the uncrowned pair) corresponds to segments 213.01-213.03 in the M(4) metallization layer. From block 422, flow proceeds to a block 424.

At block 424, any one (or more) underperforming collection is selected, each collection including one or more second segments in the M(N) layer (which connect together the corresponding standard second arrays of the uncrowned standard cells in the uncrowned pair). Block 424 includes blocks 428 and 430. In some embodiments, block 424 does not include blocks 428 and 430.

At block 428, the test data for each collection of second segments the M(N) layer (which connect together the uncrowned standard cells in the uncrowned pair) is compared against one or more quality-assessment criteria. For example, the quality-assessment criteria can be indicative of signal propagation delay, electromigration susceptibility/degradation, or the like. From block 428, flow proceeds to block 430. At block 430, any one (or more) collection regarded as underperforming (relative to the one or more quality-assessment criteria) is picked. The picked one or more collections represent the selected one or more collections.

Figure 5:
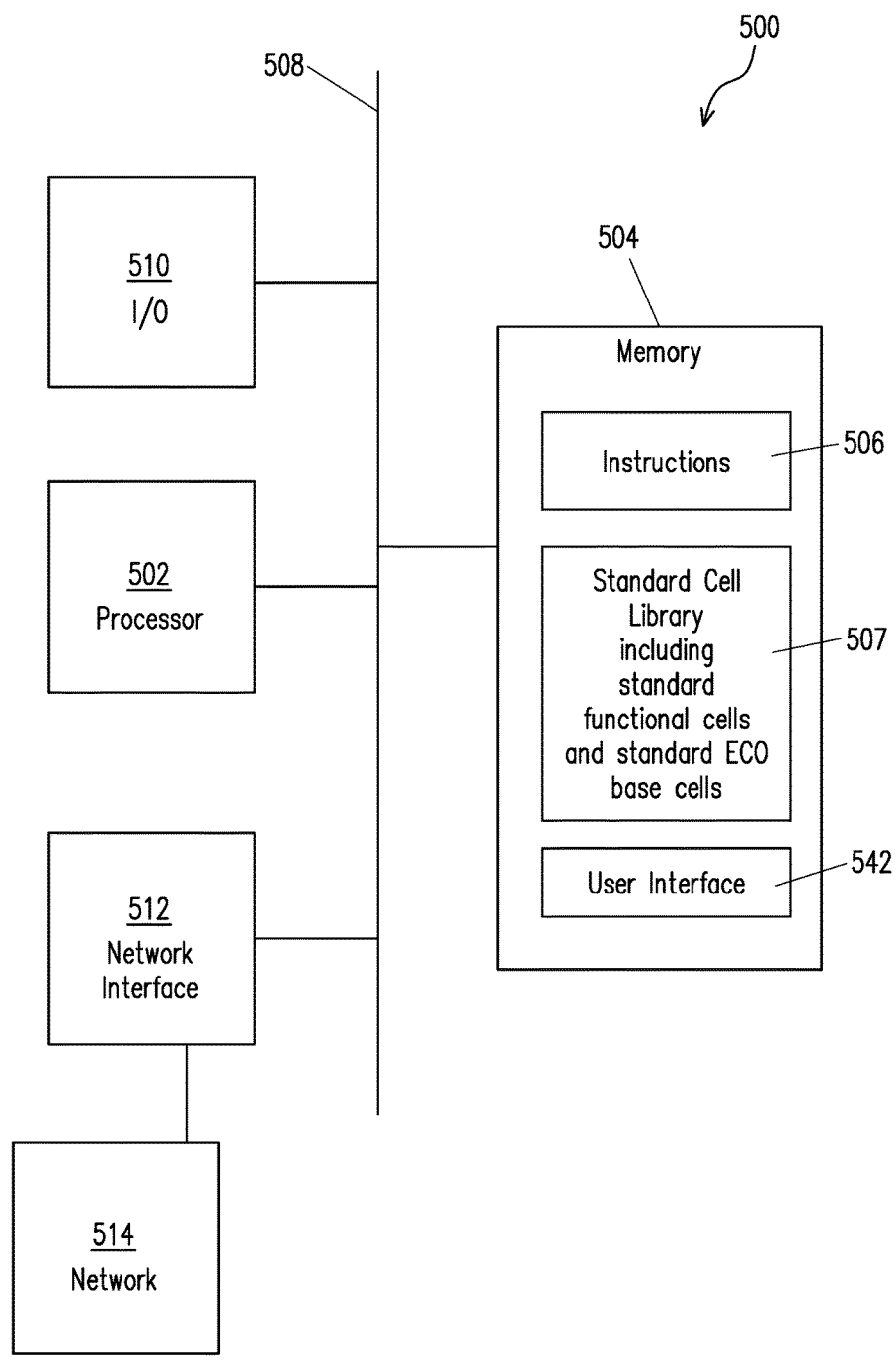
FIG. 5 is a block diagram of an EDA system, in accordance with some embodiments.

FIG. 5 is a block diagram of an electronic design automation (EDA) system 500 in accordance with some embodiments.

The method of flowcharts 400A-400B of FIGS. 4A-4B are implemented, for example, using EDA system 500, in accordance with some embodiments.

In some embodiments, EDA system 500 is a general purpose computing device including a hardware processor 502 and a non-transitory, computer-readable storage medium 504. Storage medium 504, amongst other things, is encoded with, i.e., stores, computer program code 506, i.e., a set of executable instructions. Execution of instructions 506 by hardware processor 502 represents (at least in part) an EDA tool which implements a portion or all of, e.g., the method of reconfiguring a set of uncrowned standard cells in a layout of a semiconductor apparatus, e.g., in the methods of FIGS. 4A-4B, in accordance with one or more embodiments (hereinafter, the noted processes).

Processor 502 is electrically coupled to computer-readable storage medium 504 via a bus 508. Processor 502 is also electrically coupled to an I/O interface 510 by bus 508. A network interface 512 is also electrically connected to processor 502 via bus 508. Network interface 512 is connected to a network 514, so that processor 502 and computer-readable storage medium 504 are capable of connecting to external elements via network 514. Processor 502 is configured to execute computer program code 506 encoded in computer-readable storage medium 504 in order to cause system 500 to be usable for performing a portion or all of the noted processes. In one or more embodiments, processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, storage medium 504 stores computer program code 506 configured to cause system 500 (where such execution represents (at least in part) the EDA tool) to be usable for performing a portion or all of the noted processes. In one or more embodiments, storage medium 504 also stores information which facilitates performing a portion or all of the noted processes. In one or more embodiments, storage medium 504 stores library 509 of standard cells.

EDA system 500 includes I/O interface 510. I/O interface 510 is coupled to external circuitry. In one or more embodiments, I/O interface 510 includes a keyboard, keypad, mouse, trackball, trackpad, touchscreen, and/or cursor direction keys for communicating information and commands to processor 502.

EDA system 500 also includes network interface 512 coupled to processor 502. Network interface 512 allows system 500 to communicate with network 514, to which one or more other computer systems are connected. Network interface 512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes, is implemented in two or more systems 500.

System 500 is configured to receive information through I/O interface 510. The information received through I/O interface 510 includes one or more of instructions, data, design rules, libraries of standard cells, and/or other parameters for processing by processor 502. The information is transferred to processor 502 via bus 508. EDA system 500 is configured to receive information related to a UI through I/O interface 510. The information is stored in computer-readable medium 504 as UI 542.

In some embodiments, a portion or all of the noted processes is implemented as a standalone software application for execution by a processor. In some embodiments, a portion or all of the noted processes is implemented as a software application that is a part of an additional software application. In some embodiments, a portion or all of the noted processes is implemented as a plug-in to a software application. In some embodiments, at least one of the noted processes is implemented as a software application that is a portion of an EDA tool. In some embodiments, a portion or all of the noted processes is implemented as a software application that is used by EDA system 500. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
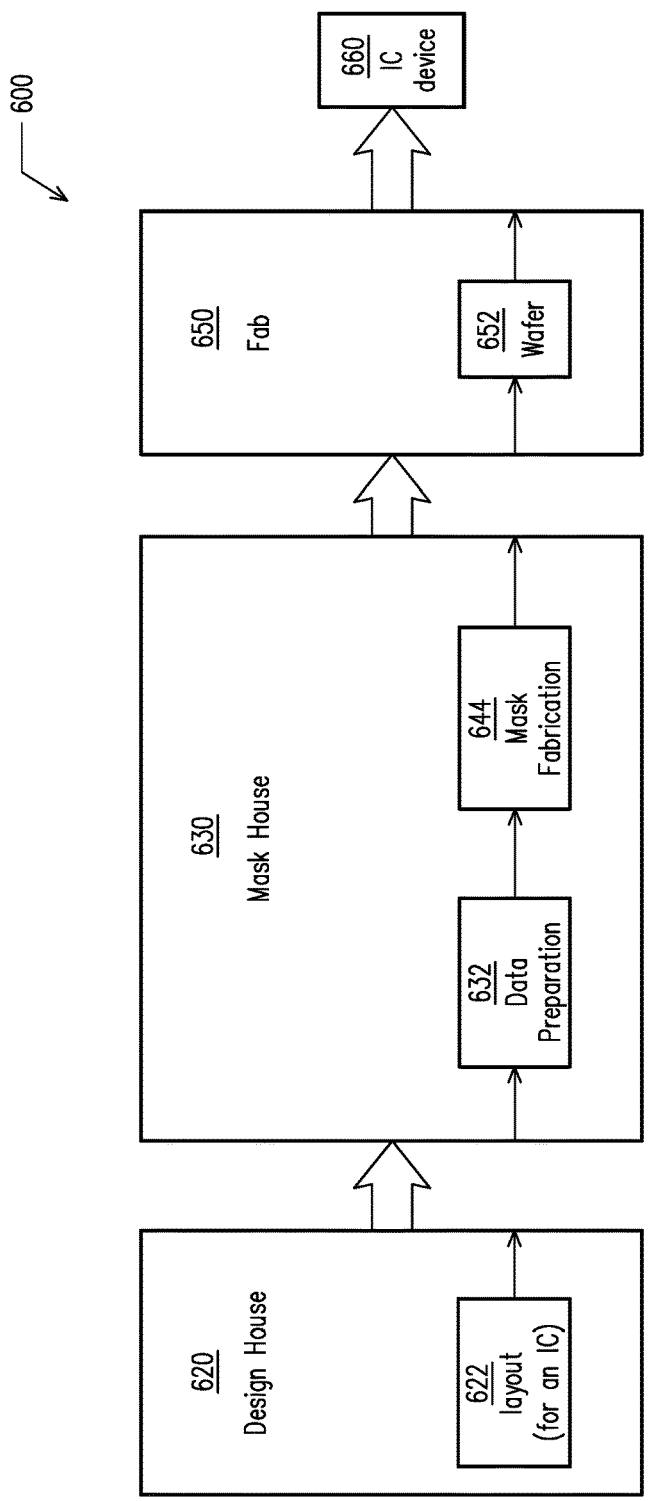
FIG. 6 is a block diagram of an integrated circuit (IC) manufacturing system, and an IC manufacturing flow associated therewith, in accordance with some embodiments.

FIG. 6 is a block diagram of an integrated circuit (IC) manufacturing system 600, and an IC manufacturing flow associated therewith, in accordance with some embodiments.

System 600 generates a design for an IC (IC design). In some embodiments, the IC design is a layout 622, e.g., generated according to one or more embodiments disclosed herein. Furthermore, system 600 fabricates at least one of (A) one or more semiconductor masks based on layout 622 or (B) at least one component in a layer of an inchoate semiconductor integrated circuit based on layout 622.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. The entities in system 600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 620, mask house 630, and IC fab 650 is owned by a single larger company. In some embodiments, two or more of design house 620, mask house 630, and IC fab 650 coexist in a common facility and use common resources.

Design house (or design team) 620 generates layout 622, e.g., according to embodiments disclosed herein. Layout 622 includes various geometrical patterns designed for an IC device 660. The geometrical patterns correspond to patterns of metal, oxide, or semiconductor layers that make up the various components of IC device 660 to be fabricated. The various layers combine to form various IC features. For example, a portion of layout 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form layout 622. The design procedure includes one or more of logic design, physical design or place and route. layout 622 is presented in one or more data files having information of the geometrical patterns. For example, layout 622 can be expressed in a GDSII file format or DFII file format.

Mask house 630 includes data preparation 632 and mask fabrication 644. Mask house 630 uses layout 622 to manufacture one or more masks to be used for fabricating the various layers of IC device 660 according to layout 622. Mask house 630 performs mask data preparation 632, where layout 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) or a semiconductor wafer. Layout 622 is manipulated by mask data preparation 632 to comply with particular characteristics of the mask writer and/or requirements of IC fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts layout 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) which checks layout 622 (after layout 622 has undergone processes in OPC) with a set of mask creation rules which contain certain geometric and/or connectivity restrictions to ensure sufficient margins, to account for variability in semiconductor manufacturing processes, and the like. In some embodiments, the MRC modifies layout 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC fab 650 to fabricate IC device 660. LPC simulates this processing based on layout 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine layout 622.

It should be understood that the above description of mask data preparation 632 has been simplified for the purposes of clarity. In some embodiments, data preparation 632 includes additional features such as a logic operation (LOP) to modify layout 622 according to manufacturing rules. Additionally, the processes applied to layout 622 during data preparation 632 may be executed in a variety of different orders.

After mask data preparation 632 and during mask fabrication 644, a mask or a group of masks are fabricated based on modified layout 622. In some embodiments, an electron-beam (e-beam) or a mechanism of multiple e-beams is used to form a pattern on a mask (photomask or reticle) based on modified layout 622. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in the semiconductor wafer, in an etching process to form various etching regions in the semiconductor wafer, and/or in other suitable processes.

IC fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 650 uses the mask (or masks) fabricated by mask house 630 to fabricate IC device 660. Thus, IC fab 650 at least indirectly uses layout 622 to fabricate IC device 660. In some embodiments, a semiconductor wafer 652 is fabricated by IC fab 650 using the mask (or masks) to form IC device 660. Semiconductor wafer 65 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 600 of FIG. 6), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One of ordinary skill in the art would recognize that operations are able to be removed or that additional operations are able to be added to at least one of the above-noted methods in general, and flowcharts 400A-400B in particular, without departing from the scope of this description. One of ordinary skill in the art would also recognize that an order of operations in at least one of the above-noted methods in general, and flowcharts 400A-400B in particular, is able to be adjusted without departing from the scope of this description.

An aspect of the present disclosure is directed to a method of reconfiguring a set of uncrowned standard cells in a layout of a semiconductor apparatus, wherein each uncrowned standard cell includes a standard first array; each standard first array including a first stacked arrangement of vias interspersed with corresponding one or more first segments of corresponding M(i)~M(N) metallization layers; and wherein the M(N) metallization layer includes one or more second segments which connect corresponding first segments of the M(N) metallization layer in the first standard arrays. The method comprises: crowning each first standard array in the set with a corresponding second standard array thereby resulting in a corresponding crowned standard cell; wherein each second standard array includes a second stacked arrangement of vias interspersed with corresponding one or more of first segments of corresponding M(N+1)~M(N+Q) metallization layers; and adding, to the M(N+Q) layer, one or more second segments which connect corresponding first segments of the M(N+Q) metallization layer in the corresponding second standard arrays, thereby resulting in the layout; wherein i, N and Q are non-negative integers, i≤N and 1≤Q; and wherein at least one of the selecting, disconnecting, crowning and adding is executed by a processor of a computer.

Another aspect of the present disclosure is directed to a computer-readable medium comprising computer-executable instructions for carrying out a method of reconfiguring a layout of uncrowned standard cells in a semiconductor apparatus, wherein each uncrowned standard cell includes a first standard array; each first standard array including a first stacked arrangement of vias interspersed with corresponding one or more first segments of corresponding M(i)~M(N) metallization layers; and wherein the M(N) metallization layer includes second segments which connect corresponding first segments of the M(N) metallization layer in the first standard arrays. The method comprises: testing the second segments of the M(N) metallization layer thereby resulting in test data; selecting, based on the test data, one or more of the second segments of the M(N) metallization layer and thereby a set of associated ones of the uncrowned standard cells; appending each first standard array in the set with a corresponding second standard array as a crown thereby resulting in a corresponding crowned standard cell; wherein each second standard array includes a second stacked arrangement of vias interspersed with corresponding one or more first segments of corresponding M(N+1)~M(N+Q) metallization layers; and operatively coupling corresponding first segments of the M(N+Q) metallization layer in the corresponding second standard arrays with corresponding one or more second segments of the M(N+Q) metallization layer in the corresponding second standard arrays, thereby resulting in the layout; wherein i, N and Q are non-negative integers, i<N and 1<Q; and wherein at least one of the selecting, disconnecting, crowning and adding is executed by a processor of a computer.

Yet another aspect of the present disclosure is directed to a semiconductor device, comprising: cells arranged into uncrowned and crowned sets, each uncrowned and crowned set including two or more corresponding ones of the cells, each cell including a first array; wherein each first array includes a first stacked arrangement of vias interspersed with corresponding one or more first segments of corresponding M(i)~M(N) metallization layers; wherein, for each uncrowned set, first segments of the M(N) metallization layer in the first arrays of the corresponding two or more cells are connected by corresponding one or more second segments of the M(N) metallization layer; wherein, for each crowned set, the two or more cells each include a corresponding second array, each second array including a second stacked arrangement of vias interspersed with corresponding one or more first segments of corresponding M(N+1)~M(N+Q) metallization layers; wherein, for each crowned set, one or more of the first segments of the M(N+Q) metallization layer in the second arrays of the corresponding two or more cells are connected by corresponding one or more second segments of the M(N+Q) metallization layer; and wherein N and Q are non-negative integers, i≤N and 1≤Q.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of reconfiguring a set of uncrowned standard cells in a layout of a semiconductor apparatus,
wherein each uncrowned standard cell includes a standard first array;
each standard first array including a first stacked arrangement of vias interspersed with corresponding one or more first segments of corresponding M(i)~M(N) metallization layers; and
wherein the M(N) metallization layer includes one or more second segments which connect corresponding first segments of the M(N) metallization layer in the first standard array of each uncrowned standard cell in the set;

the method comprising:
crowning each first standard array in the set with a corresponding second standard array thereby resulting in a corresponding crowned standard cell;
wherein each second standard array includes a second stacked arrangement of vias interspersed with corresponding one or more of first segments of corresponding M(N+1)~M(N+Q) metallization layers; and
adding, to the M(N+Q) layer, one or more second segments which connect corresponding first segments of the M(N+Q) metallization layer in the corresponding second standard arrays, thereby resulting in the layout;
wherein i, N and Q are non-negative integers, i≤N and 1≤Q; and
wherein at least one of the disconnecting, crowning and adding is executed by a processor of a computer.

2. The method of claim 1, wherein:
the set of uncrowned standard cells is a subset of a superset of uncrowned standard cells in the layout; and
the method further comprises:
testing second segments of the M(N) metallization layer associated with the superset of uncrowned standard cells thereby resulting in test data; and
selecting, based on the test data, one or more of the second segments of the M(N) metallization layer and thereby associated ones of the uncrowned standard cells, the associated ones of the uncrowned standard cells representing members of the subset.

3. The method of claim 2, wherein the selecting includes:
comparing the test data against one or more corresponding quality-assessment criteria; and
picking one or more of the second segments of the M(N) metallization layer based on the comparison, the picked one or more of the second segments of the M(N) metallization layer representing the selected one or more of the second segments of the M(N) metallization layers.

4. The method of claim 3, wherein the one or more quality-assessment criteria include at least one of:
a first figure of merit representing signal-propagation delay; or
a second figure of merit representing a susceptibility to electromigration.

5. The method claim 2, wherein:
a number of members in the subset is less than about 50% of a number of members in the superset.

6. The method of claim 5, wherein:
the number of members in the subset is less than about 1% of the number of members of the superset.

7. The method of claim 1, further comprising:
fabricating, based on the layout, at least one of (A) one or more semiconductor masks or (B) at least one component in a layer of an inchoate semiconductor integrated circuit.

8. The method of claim 1, further comprising:
disconnecting the one or more second segments of the M(N) layer.

9. The method of claim 1, wherein the disconnecting includes:
removing the one or more second segments of the M(N) layer.

10. A computer-readable medium (CRM) comprising computer-executable instructions for carrying out a method of reconfiguring a layout of uncrowned standard cells in a semiconductor apparatus,
wherein each uncrowned standard cell includes a first standard array;
each first standard array including a first stacked arrangement of vias interspersed with corresponding one or more first segments of corresponding M(i)~M(N) metallization layers; and
wherein the M(N) metallization layer includes second segments which connect corresponding first segments of the M(N) metallization layer in the first standard arrays;
the method comprising:
testing the second segments of the M(N) metallization layer thereby resulting in test data;
selecting, based on the test data, one or more of the second segments of the M(N) metallization layer and thereby a set of associated ones of the uncrowned standard cells;
appending each first standard array in the set with a corresponding second standard array as a crown thereby resulting in a corresponding crowned standard cell;
wherein each second standard array includes a second stacked arrangement of vias interspersed with corresponding one or more first segments of corresponding M(N+1)~M(N+Q) metallization layers; and
operatively coupling corresponding first segments of the M(N+Q) metallization layer in the corresponding second standard arrays to one or more second segments of the M(N+Q) metallization layer, thereby resulting in the layout;
wherein N and Q are non-negative integers, i≤N and 1≤Q; and
wherein at least one of the testing, selecting, removing, appending and operatively coupling is executed by a processor of a computer.

11. The CRM of claim 10, wherein the testing includes:
comparing the test data against one or more corresponding quality-assessment criteria.

12. The CRM of claim 11, wherein the one or more quality-assessment criteria include at least one of:
a first figure of merit representing signal-propagation delay; or
a second figure of merit representing a susceptibility to electromigration.

13. The CRM of claim 10, wherein:
a number of members in the set of associated uncrowned standard cells is less than about 50% of a total number of all uncrowned standard cells in the layout.

14. The CRM of claim 13, wherein
the number of members in the set of associated uncrowned standard cells is less than about 1% of the total number of all uncrowned standard cells in the layout.

15. The CRM of claim 10, wherein:
controlling a semiconductor fabrication process to fabricate, based on the layout, at least one of (A) one or more semiconductor masks or (B) at least one component in a layer of an inchoate semiconductor integrated circuit.

16. The CRM of claim 10, further comprising:
removing the one or more selected second segments of the M(N) layer.

17. A semiconductor apparatus comprising:
cells arranged into uncrowned and crowned sets, each uncrowned and crowned set including two or more corresponding ones of the cells, each cell including a first array;
wherein each first array includes a first stacked arrangement of vias interspersed with corresponding one or more first segments of corresponding M(i)~M(N) metallization layers;
wherein, for each uncrowned set, first segments of the M(N) metallization layer in the first arrays of the corresponding two or more cells are connected by corresponding one or more second segments of the M(N) metallization layer;
wherein, for each crowned set, the two or more cells each include a corresponding second array, each second array including a second stacked arrangement of vias interspersed with corresponding one or more first segments of corresponding M(N+1)~M(N+Q) metallization layers;
wherein, for each crowned set, one or more of the first segments of the M(N+Q) metallization layer in the second arrays of the corresponding two or more cells are connected by corresponding one or more second segments of the M(N+Q) metallization layer; and
wherein N and Q are non-negative integers, i<N and 1<Q.

18. The semiconductor apparatus claim 17, wherein:
a subtotal number of cells in the crowned sets is less than about 50% of a sum of the first subtotal and a second subtotal number of cells in the uncrowned sets.

19. The semiconductor apparatus claim 18, wherein:
the first subtotal number is less than about 1% of the sum.

20. The semiconductor apparatus of claim 17, wherein:
the M(N) metallization layer uses a first pitch, and the M(N+Q) metallization layer uses a second pitch, wherein the first pitch is less than the second pitch.

* * * * *